(12) United States Patent
Mikawa et al.

(10) Patent No.: US 9,082,968 B2
(45) Date of Patent: Jul. 14, 2015

(54) VARIABLE RESISTANCE NON-VOLATILE MEMORY DEVICE AND MANUFACTURING METHOD THEREOF

(71) Applicant: PANASONIC CORPORATION, Osaka (JP)

(72) Inventors: Takumi Mikawa, Shiga (JP); Shinichi Yoneda, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 159 days.

(21) Appl. No.: 13/876,362

(22) PCT Filed: Nov. 15, 2012

(86) PCT No.: PCT/JP2012/007336
§ 371 (c)(1),
(2) Date: Mar. 27, 2013

(87) PCT Pub. No.: WO2013/073187
PCT Pub. Date: May 23, 2013

(65) Prior Publication Data
US 2014/0312293 A1    Oct. 23, 2014

(30) Foreign Application Priority Data

Nov. 17, 2011   (JP) .................................. 2011-252079

(51) Int. Cl.
*H01L 45/00*   (2006.01)
*H01L 27/24*   (2006.01)

(52) U.S. Cl.
CPC ........ *H01L 45/1266* (2013.01); *H01L 27/2481* (2013.01); *H01L 45/08* (2013.01);
(Continued)

(58) Field of Classification Search
CPC ... H01L 45/146; H01L 45/1233; H01L 45/08; H01L 27/2436; H01L 45/1625; H01L 27/101

USPC ........... 365/148; 438/382; 257/2–4, E21.004, 257/E47.001
See application file for complete search history.

(56) References Cited

U.S. PATENT DOCUMENTS

2009/0039332 A1 *   2/2009   Lee et al. ........................ 257/4
2009/0283736 A1   11/2009   Kanzawa et al.
(Continued)

OTHER PUBLICATIONS

International Search Report issued in International Patent Application No. PCT/JP2012/007336 mailed on Dec. 11, 2012.

*Primary Examiner* — David Vu
*Assistant Examiner* — Jonathan Han
(74) *Attorney, Agent, or Firm* — McDermott Will & Emery LLP

(57) ABSTRACT

In a method of manufacturing a variable resistance non-volatile memory device including non-volatile memory element layers stacked together by repeating the step (S100, S200 . . . ) of forming a non-volatile memory element layer plural times, when a thickness of the second metal oxide layer included in each of the non-volatile memory element layers just after the step of forming the corresponding non-volatile memory element layer is completed is a thickness in formation, and when an area of a portion of the second metal oxide layer included in each of the non-volatile memory element layers and a portion of the first metal oxide layer included in the corresponding non-volatile memory element layer, which portions are in contact with each other, just after the step of forming the corresponding non-volatile memory element layer is completed is an area in formation, at least one of the thickness in formation and the area in formation is made different among the steps of forming the non-volatile memory element layers, to cause all of the non-volatile memory elements in a state in which formation of an uppermost non-volatile memory element layer is completed, to have an equal initial resistance.

20 Claims, 21 Drawing Sheets

(52) U.S. Cl.
CPC .......... *H01L 45/085* (2013.01); *H01L 45/145* (2013.01); *H01L 45/146* (2013.01); *H01L 45/1608* (2013.01); *H01L 45/1675* (2013.01)

(56) References Cited

U.S. PATENT DOCUMENTS

| | | |
|---|---|---|
| 2010/0259966 A1 | 10/2010 | Kanzawa et al. |
| 2010/0314602 A1 | 12/2010 | Takano et al. |
| 2011/0031468 A1 | 2/2011 | Fukumizu et al. |
| 2011/0294259 A1 | 12/2011 | Kanzawa et al. |
| 2012/0063201 A1 | 3/2012 | Hayakawa et al. |
| 2012/0068148 A1 | 3/2012 | Kawashima et al. |
| 2012/0252184 A1 | 10/2012 | Ninomiya et al. |
| 2012/0267598 A1* | 10/2012 | Sakotsubo et al. ............. 257/4 |
| 2012/0280199 A1* | 11/2012 | Takagi ............................ 257/3 |
| 2013/0092893 A1* | 4/2013 | Kawashima et al. ............ 257/2 |
| 2013/0119344 A1* | 5/2013 | Mikawa et al. ................. 257/4 |

* cited by examiner

US 9,082,968 B2

VARIABLE RESISTANCE NON-VOLATILE MEMORY DEVICE AND MANUFACTURING METHOD THEREOF

RELATED APPLICATIONS

This application is the U.S. National Phase under 35 U.S.C. §371 of International Application No. PCT/JP2012/007336, filed on Nov. 15, 2012, which in turn claims the benefit of Japanese Application No. 2011-252079, filed on Nov. 17, 2011, the disclosures of which Applications are incorporated by reference herein.

TECHNICAL FIELD

The present invention relates to a variable resistance non-volatile memory device which is configured to change its resistance value in response to a voltage pulse applied thereto.

BACKGROUND ART

In recent years, with progresses of digital technologies, electronic devices such as portable information devices and information home appliances have been developed to achieve higher functionalities. With achievement of the higher functionalities of the electronic devices, semiconductor elements incorporated into the electronic devices have been developed at a high pace to attain further miniaturization and a higher speed. Among them, the uses of a non-volatile memory with a high capacity which is represented by a flash memory have been expanding at a high space. Moreover, as a new non-volatile memory in a next generation which has a potential of replacing this flash memory, development of a variable resistance non-volatile memory element including a variable resistance element has been progressing. The variable resistance element refers to an element which has a characteristic in which its resistance value changes reversibly in response to an electric signal applied thereto, and is able to store information corresponding to the resistance value in a non-volatile manner.

As an exemplary variable resistance element, there has been proposed a semiconductor memory device incorporating a variable resistance layer including transition metal oxides which are different from each other in oxygen content atomic percentage and are stacked together. For example, Patent Literature 1 discloses that a redox reaction is caused to take place selectively in a region of an interface between an electrode and a variable resistance layer with a higher oxygen content atomic percentage, contacting the electrode, and resistance change is stabilized.

A variable resistance layer of a non-volatile memory element disclosed in Patent Literature 2 includes a first variable resistance layer and a second variable resistance layer, the first variable resistance layer comprises a first transition metal oxide, the second variable resistance layer comprises a second transition metal oxide and a third transition metal oxide, the second transition metal oxide has a lower oxygen content atomic percentage than the first transition metal oxide and the third transition metal oxide, and the second transition metal oxide and the third transition metal oxide are in contact with the first variable resistance layer.

CITATION LISTS

Patent Literature

Patent Literature 1: International Publication WO2008/149484

Patent Literature 2: International Publication WO2011/114725

SUMMARY OF INVENTION

Technical Problem

An object is to suppress fluctuation of element characteristics in a case where non-volatile memory elements each including a variable resistance layer including a plurality of metal oxide layers which are different from each other in oxygen content atomic percentage and are stacked together, are stacked together, more effectively than a conventional configuration.

Solution to Problem

To achieve the above described object, according to the present invention, there is provided a method of manufacturing a variable resistance non-volatile memory device including non-volatile memory element layers stacked together by repeating the step of forming a non-volatile memory element layer plural times, the step of forming the non-volatile memory element layer including the steps of: forming a lower electrode layer; forming a variable resistance layer on and above the lower electrode layer; and forming an upper electrode layer on and above the variable resistance layer; and the step of forming the variable resistance layer including the steps of: forming a first metal oxide layer comprising a first metal oxide; and forming a second metal oxide layer comprising a second metal oxide having a higher oxygen content atomic percentage than the first metal oxide; wherein when a thickness of the second metal oxide layer included in each of the non-volatile memory element layers just after the step of forming the corresponding non-volatile memory element layer is completed is a thickness in formation, and when an area of a portion of the second metal oxide layer included in each of the non-volatile memory element layers and a portion of the first metal oxide layer included in the corresponding non-volatile memory element layer, which portions are in contact with each other, just after the step of forming the corresponding non-volatile memory element layer is completed is an area in formation, at least one of the thickness in formation and the area in formation is made different among the steps of forming the non-volatile memory element layers, to cause all of the non-volatile memory elements in a state in which formation of an uppermost non-volatile memory element layer is completed, to have an equal initial resistance.

In this configuration, it becomes possible to suppress fluctuation of element characteristics in a case where non-volatile memory elements each including a variable resistance layer including a plurality of metal oxide layers which are different from each other in oxygen content atomic percentage and are stacked together, are stacked together, more effectively, than a conventional configuration.

According to the present invention, there is provided a variable resistance non-volatile memory device comprising non-volatile memory element layers stacked together, each of the non-volatile memory element layers including a lower electrode layer, a variable resistance layer formed on and above the lower electrode layer, and an upper electrode layer formed on and above the variable resistance layer; the variable resistance layer including a first metal oxide layer comprising a first metal oxide, and a second metal oxide layer comprising a second metal oxide having a higher oxygen content atomic percentage than the first metal oxide; when a thickness of the second metal oxide layer included in each of the non-volatile memory element layers just after formation of the corresponding non-volatile memory element layer is completed is a thickness in formation, and when an area of a portion of the second metal oxide layer included in each of the non-volatile memory element layers and a portion of the first metal oxide layer included in the corresponding non-volatile memory element layer, which portions are in contact with each other, just after formation of the corresponding non-volatile memory element layer is completed is an area in formation, at least one of the thickness in formation and the area in formation is made different among the non-volatile memory element layers, to cause all of the non-volatile memory elements to have an equal initial resistance.

In this configuration, it becomes possible to suppress fluctuation of element characteristics in a case where non-volatile memory elements each including a variable resistance layer including a plurality of metal oxide layers which are different from each other in oxygen content atomic percentage and are stacked together, are stacked together, more effectively, than a conventional configuration.

Advantageous Effects of the Invention

In a variable resistance non-volatile memory device and a manufacturing method thereof of the present invention, it becomes possible to suppress fluctuation of element characteristics in a case where non-volatile memory elements each including a variable resistance layer including a plurality of metal oxide layers which are different from each other in oxygen content atomic percentage and are stacked together, are stacked together, more effectively, than a conventional variable resistance non-volatile memory device and a conventional manufacturing method thereof.

DESCRIPTION OF THE INVENTION

The present inventors developed a variable resistance non-volatile memory device capable of lowering of a break voltage of a variable resistance non-volatile memory element and suppressing fluctuation of break voltages among elements, and a manufacturing method thereof. The term "break" refers to a step in which after manufacturing the non-volatile memory element, a filament (electric conductive path) is formed in a variable resistance layer having a higher oxygen content atomic percentage, thereby enabling a resistance changing operation to occur smoothly thereafter. The term "break voltage" refers to a voltage applied between two electrodes of the variable resistance non-volatile memory element after manufacturing the non-volatile memory element, to perform the break.

Figure 1:
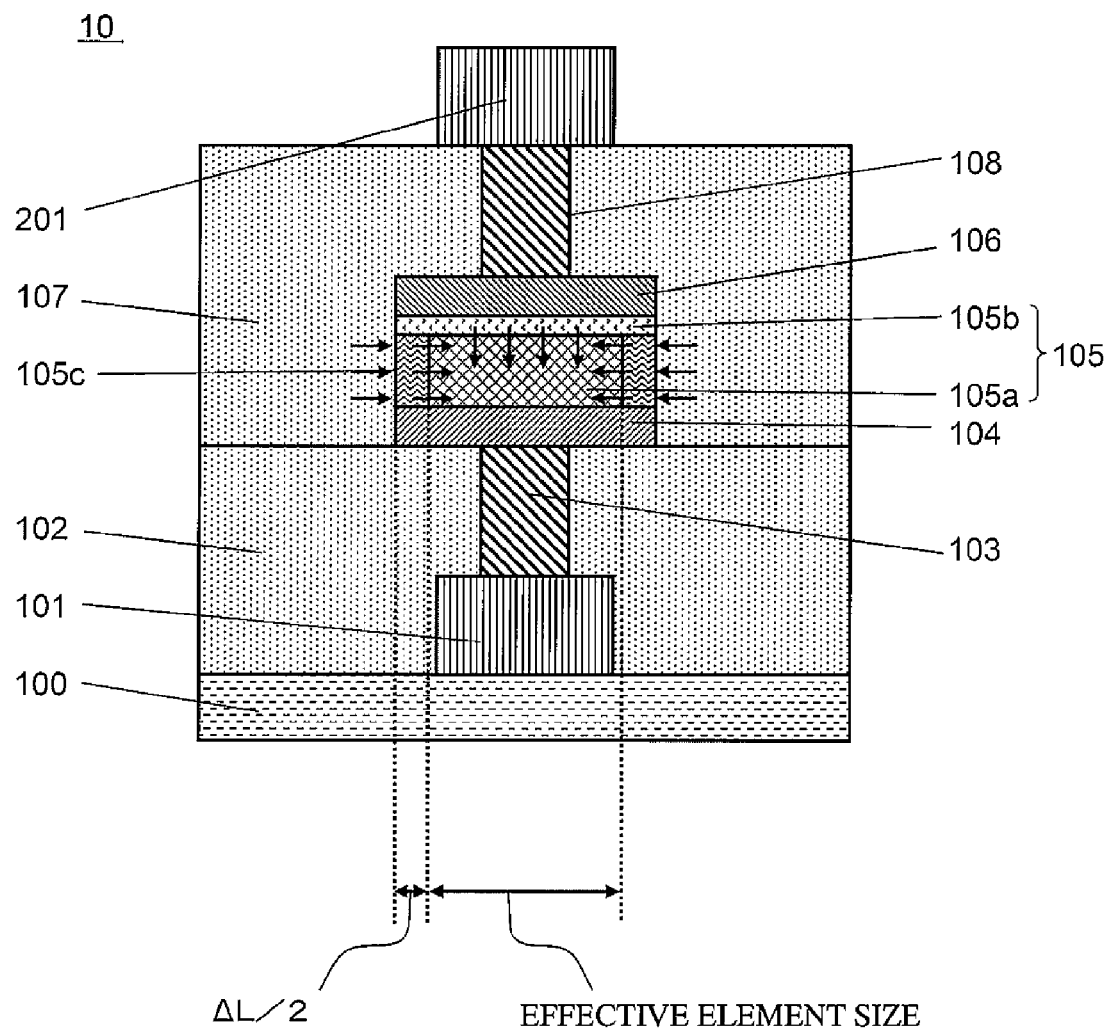
FIG. 1 is a cross-sectional view showing an exemplary configuration of a non-volatile memory element.

FIG. 1 is a cross-sectional view showing an exemplary configuration of a non-volatile memory element. A non-volatile memory element 10 includes a substrate 100 provided with a first wire 101, a first interlayer insulating layer 102 formed on and above the substrate 100 such that it covers the first wire 101, and a first contact plug 103 penetrating the first interlayer insulating layer 102 and being electrically connected to the first wire 101. A non-volatile memory element including a lower electrode layer 104, a variable resistance layer 105 and an upper electrode layer 106 is formed such that it covers the first contact plug 103. A second interlayer insulating layer 107 is formed such that it covers the non-volatile memory element. A second contact plug 108 is formed such that it penetrates the second interlayer insulating layer 107 and is electrically connected to the upper electrode layer 106. A second wire 201 is formed such that it covers the second contact plug 108.

The variable resistance layer 105 has a stacked-layer structure including a first metal oxide layer 105a and a second metal oxide layer 105b which are stacked together. The first metal oxide layer 105a comprises a metal oxide containing, for example, oxygen-deficient tantalum oxide ($TaO_x$, $0<x<2.5$) as a major component. For example, a metal oxide (hereinafter referred to as second metal oxide) constituting the second metal oxide layer 105b has a higher oxygen content atomic percentage than a metal oxide (hereinafter referred to as first metal oxide) constituting the first metal oxide layer 105a. For example, when the second metal oxide layer 105b comprises tantalum oxide (TaO$_y$), the oxygen content atomic percentage of the second metal oxide is higher than the oxygen content atomic percentage of the first metal oxide (x<y). When the second metal oxide layer 105b comprises a metal other than tantalum, the oxygen content atomic percentage of the second metal oxide is higher than the oxygen content atomic percentage of the first metal oxide.

In addition to the above, as shown in FIG. 1, a third metal oxide layer 105c which is a substantially insulating layer and has a higher oxygen content atomic percentage may be formed to surround the first metal oxide layer 105a. The third metal oxide layer 105c (z>x, when the metal oxide is TaO$_z$) is in contact with at least a portion of a second surface (bottom surface in FIG. 1) of the second metal oxide layer 105b, while the first metal oxide layer 105a is in contact with the remaining portion of the second surface (bottom surface in FIG. 1) of the second metal oxide layer 105b.

In accordance with this configuration, since the third metal oxide layer 105c having a higher resistance value is disposed on a side portion of the first metal oxide layer 105a having a lower resistance value, an area (effective area) of the first metal oxide layer 105a having a lower resistance value in a horizontal direction is smaller than an area of an electrode region of the upper electrode layer 107. This results in an increase in a density of a current flowing from the first metal oxide layer 105a to the second metal oxide layer 105b, thereby facilitating formation of an electric conductive path in the second metal oxide layer 105b. Therefore, the break voltage of the non-volatile memory element can be lowered.

However, it was found out that when a plurality of layers each including the above stated non-volatile memory element 10 were stacked together, there was fluctuation of resistance changing characteristics between the non-volatile memory element disposed in a lower layer and the non-volatile memory element disposed in an upper layer.

To research a cause of the above stated fluctuation, the present inventors conducted experiments as follows.

Experiment 1

In Experiment 1, metal oxides which were different from each other in oxygen content atomic percentage were stacked together, and oxygen profiles which were formed before and after thermal treatment were measured by AES (Auger Electron Spectroscopy).

In the present experiment, on an SiN substrate for analysis, TaO$_x$ (thickness: 30 nm, resistivity: 6 mΩ·cm, oxygen content atomic percentage: about 60%) was deposited by reactive sputtering, and Ta$_2$O$_5$ (thickness: 6 nm, resistivity: insulator, oxygen content atomic percentage: about 72%) was deposited on the TaO$_x$ by sputtering using a Ta$_2$O$_5$ target. The resulting sample was subjected to heating (in nitrogen atmosphere, 400 degrees C., for 10 minutes). A comparison was made for the oxygen profile between the sample which has gone through the heating and the sample which has not gone through the heating (before annealing).

Figure 2:
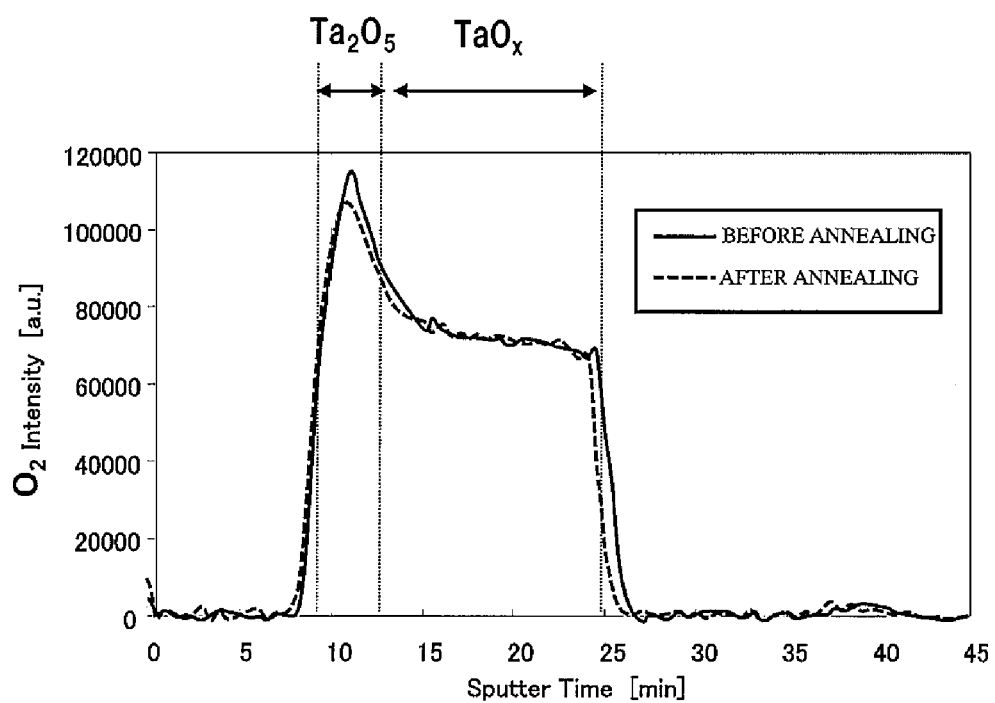
FIG. 2 is a view of a result of Experiment 1.

FIG. 2 is a view of a result of Experiment example 1. A horizontal axis represents a depth by "Sputter Time [min]", while a vertical axis represents "O$_2$ Intensity" of oxygen by an arbitrary unit (a.u.). As the signal intensity is higher, the oxygen concentration (oxygen content atomic percentage) is higher. As shown in FIG. 2, each of the oxygen profiles had a double-layer structure because of the difference in oxygen content atomic percentage between the TaO$_x$ layer and the Ta$_2$O$_5$ layer. A peak of oxygen in the Ta$_2$O$_5$ layer was lower in the sample after the annealing than in the sample before the annealing. This implied that oxygen in the Ta$_2$O$_5$ layer diffused into the TaO$_x$ layer by the heating process.

Experiment 2

In Experiment 2, regarding the element having a structure in which the variable resistance layer comprising metal oxides which were different from each other in oxygen content atomic percentage and were stacked together was sandwiched between a pair of electrodes, a comparison was made for initial resistance between the element before the heating process and the element after the heating process.

In the present experiment, silicon nitride was deposited on a silicon wafer, and TiAlN (thickness: 50 nm) and TaN (thickness: 70 nm) were deposited on and above the silicon nitride in this order by sputtering, to form a lower electrode layer. TaO$_x$ (thickness: 30 nm, resistivity: 6 mΩ·cm, oxygen content atomic percentage: about 60%) was deposited on and above the lower electrode layer by reactive sputtering. Ta$_2$O$_5$ (resistivity: insulator, oxygen content atomic percentage: about 72%) was deposited on and above the TaO$_x$ by sputtering using the Ta$_2$O$_5$ target. Thicknesses of Ta$_2$O$_5$ layers were set to 4.2 nm, 4.9 nm, and 5.5 nm, respectively. Ir (thickness: 80 nm) and TiAlN (thickness: 100 nm) were deposited on each of the Ta$_2$O$_5$ layers in this order by sputtering, to form an upper electrode layer. The elements were set to have a square shape of having a size of (50 μm×50 μm). Regarding the created three samples, resistance values before and after the heating process (in nitrogen atmosphere, 400 degrees C., for 10 minutes) were measured. An applied voltage was 50 mV.

Figure 3:
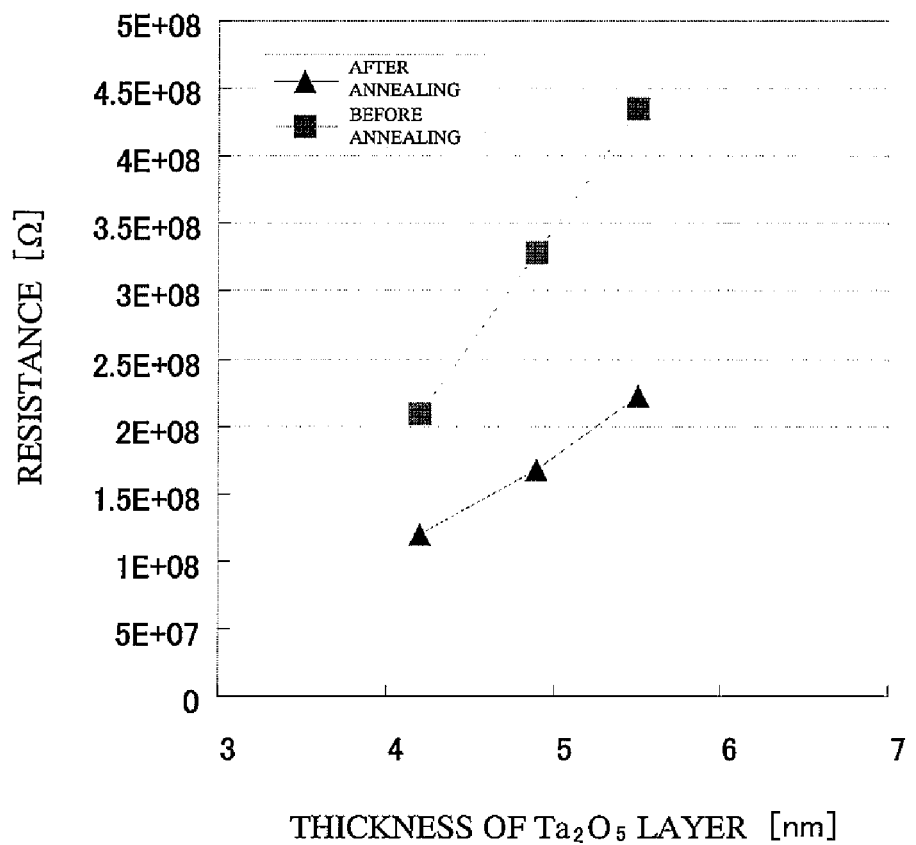
FIG. 3 is a view of a result of Experiment 2.

FIG. 3 is a view of a result of Experiment 2. A horizontal axis indicates a thickness (higher-resistance layer thickness) of the Ta$_2$O$_5$ layer, while a vertical axis indicates resistance of the variable resistance element. "E+08" indicates "×10$^8$". As can be seen from FIG. 3, as the thickness of the Ta$_2$O$_5$ layer increased, the resistance became higher. The resistance was lowered by the heating process. This result implied that oxygen in the Ta$_2$O$_5$ layer diffused into the TaO$_x$ layer by the heating process and thereby the thickness of the Ta$_2$O$_5$ layer decreased.

Experiment 3

In Experiment 3, research was conducted as to how characteristics of the lower element were affected due to heating in the step of forming the upper element in the case where the elements each including the third metal oxide layer shown in FIG. 1 were stacked in two layers.

In the present experiment, three samples were created, which were a sample (Ref) consisting of a single layer, a sample (TEOS) including the interlayer insulating layer comprising TEOS (tetraethyl orthosilicate), and a sample (FSG) including the interlayer insulating layer comprising FSG (fluorinated silicate glass).

Regarding each of these samples, six elements having sides which were different from each other in a range of about 0.3 μm to about 0.9 μm. The sizes (lengths of one side) of the elements were plotted to X-axis, inverses (R$^{-1/2}$) of square roots of initial resistances were plotted to Y-axis, linear portions were extrapolated, and intersections with the X-axis were found. The values (x) of the intersections were ΔL.

ΔL/2 corresponded to a width (horizontal thickness in FIG. 1, the same occurs hereinafter) of the formed third metal oxide layer. An effective element size was a value derived by subtracting ΔL from the size of the element. The effective element size corresponded to an area (area of the upper end surface of the first metal oxide layer in FIG. 1) of a portion of the first metal oxide layer and a portion of the second metal oxide layer, which portions were in contact with each other, in the completed sample.

The samples were created as described below.

The sample (Ref) consisting of a single layer was formed as follows. An aluminum wire was formed on and above the silicon wafer, and TEOS was deposited by plasma CVD, thereby forming the interlayer insulating layer. A contact hole (diameter: 250 nm) was formed in the interlayer insulating layer by etching, and tungsten was filled into the contact hole by CVD to form a contact plug.

TiN (thickness: 20 nm) and TaN (thickness: 20 nm) were deposited in this order by sputtering such that they cover the contact plug. TaO$_x$ (thickness: 30 nm, resistivity: 6 mΩ·cm, oxygen content atomic percentage: about 60%) was deposited on and above the TaN layer by reactive sputtering. Ta$_2$O$_5$ (resistivity: insulator, oxygen content atomic percentage: about 72%) was deposited on and above the TaO$_x$ layer by sputtering using the Ta$_2$O$_5$ target. Ir (thickness: 80 nm) was deposited on and above the Ta$_2$O$_5$ layer by sputtering. Then, using masks and by etching, six non-volatile memory elements which were different from each other in size were formed.

TEOS was deposited by plasma CVD (350 degrees C., hereinafter the same occurs) such that it covers the non-volatile memory element, to form the interlayer insulating layer. A contact hole (diameter: 250 nm) was formed in the interlayer insulating layer by etching, and tungsten was filled into the contact hole by CVD to form a contact plug. Finally, an aluminum wire was formed such that it covers the contact plug.

The sample (TEOS) including the interlayer insulating layer comprising TEOS was formed as follows. On the sample formed like the sample (Ref) consisting of a single layer, TEOS was further deposited by the plasma CVD, to form the interlayer insulating layer. A contact hole (diameter: 250 nm) was formed in the interlayer insulating layer by etching, and tungsten was filled into the contact hole by CVD to form a contact plug.

TiN (thickness: 20 nm) and TaN (thickness: 20 nm) were deposited in this order by sputtering such that they cover the contact plug. TaO$_x$ (thickness: 30 nm, resistivity: 6 mΩ·cm, oxygen content atomic percentage: about 60%) was deposited on and above the TaN layer by reactive sputtering. Ta$_2$O$_5$ (resistivity: insulator, oxygen content atomic percentage: about 72%) was deposited on and above the TaO$_x$ layer by sputtering using the Ta$_2$O$_5$ target. Ir (thickness: 80 nm) was deposited on and above the Ta$_2$O$_5$ layer by sputtering. Then, using masks having the same shapes as those of the lower element and by etching, six non-volatile memory elements which were different from each other in size were formed.

TEOS was deposited by plasma CVD such that it covers the non-volatile memory element, to form an interlayer insulating layer. A contact hole (diameter: 250 nm) was formed in the interlayer insulating layer by etching, and tungsten was filled into the contact hole by the CVD to form a contact plug. Finally, an aluminum wire was formed such that it covers the contact plug.

The sample (FSG) including the interlayer insulating layer comprising FSG was formed in the same method as that of the sample (TEOS) including the interlayer insulating layer comprising TEOS except that FSG was deposited by the plasma CVD (480 degrees C.) with a high density, to form all interlayer insulating layers.

Figure 4:
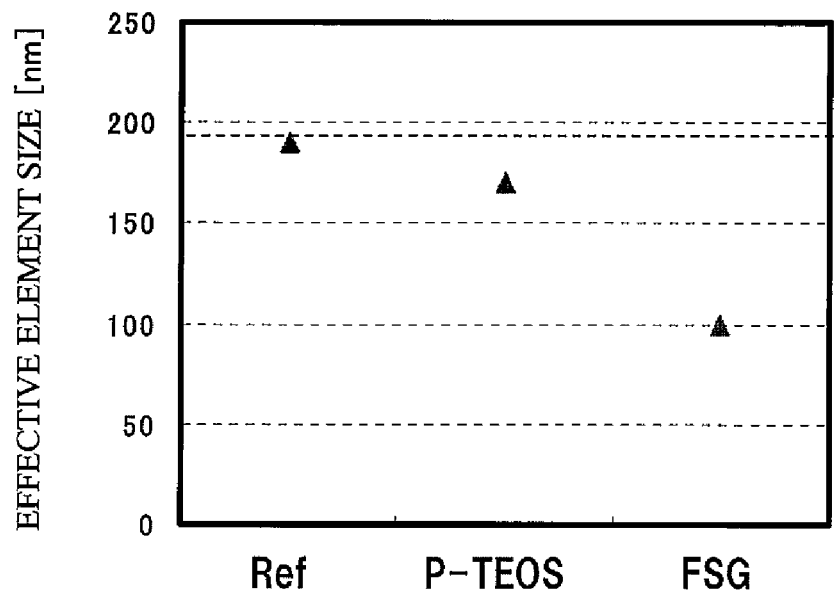
FIG. 4 is a view showing a comparison among effective element sizes of elements formed using a mask having a size of (500 nm×500 nm), regarding three samples created in Experiment 3.

FIG. 4 is a view showing a comparison among effective element sizes (effective lengths of sides) of the elements formed using a mask having a size of (500 nm×500 nm), regarding the three samples created in Experiment 3. FIG. 4 shows the effective element sizes of the elements included in the lower layers, regarding the sample (TEOS) including the interlayer insulating layer comprising TEOS and the sample (FSG) including the interlayer insulating layer comprising FSG As shown in FIG. 4, the effective element size was smaller in the sample (TEOS) including the interlayer insulating layer comprising TEOS than in the sample (Ref) consisting of a single layer. This result implied that, in the lower non-volatile memory element, oxygen diffused from the interlayer insulating layer to the third metal oxide layer and from the third metal oxide layer to the first metal oxide layer, due to the heating in the step of forming the upper non-volatile memory element, the width of the first metal oxide layer became smaller, and as a result, the effective element size became smaller.

The effective size became smaller in the sample (FSG) including the interlayer insulating layer comprising FSG than the sample (TEOS) including the interlayer insulating layer comprising TEOS. This result might be attributed to the fact that diffusion of oxygen occurred more noticeably in the sample (FSG) including the interlayer insulating layer comprising FSG because the temperature was higher in the step of depositing FSG (480 degrees C.) than in the step of depositing TEOS (350 degrees C.).

Figure 5:
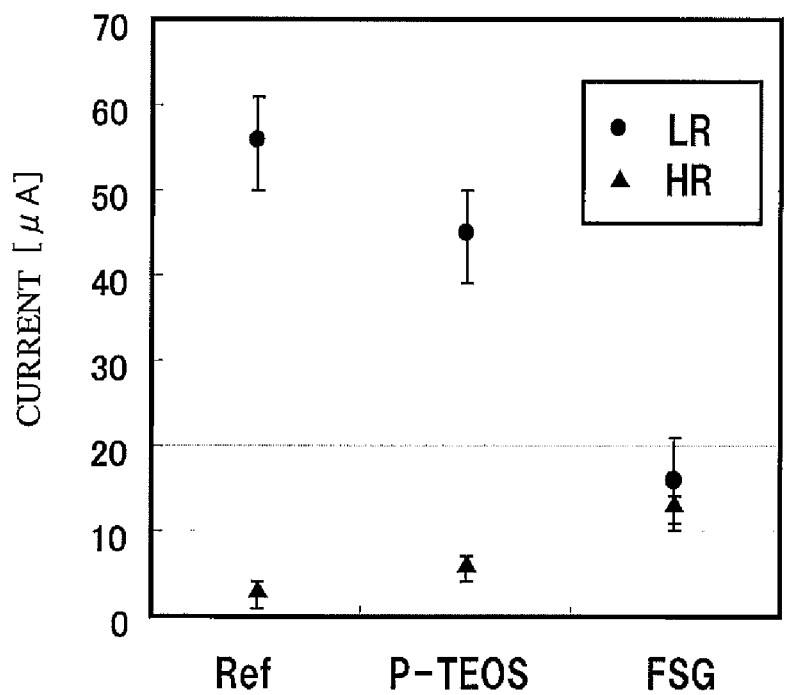
FIG. 5 is a view showing a comparison between a current value (HR) corresponding to a higher-resistance state and a current value (LR) corresponding to a lower-resistance state, which occur in a case where the elements included in the three samples created in Experiment 3 and formed using the mask having a size of (500 nm×500 nm), are caused to perform a resistance changing operation.

FIG. 5 is a view showing a comparison between a current value (HR) corresponding to a higher-resistance state and a current value (LR) corresponding to a lower-resistance state, which occurred in a case where the elements included in the three samples created in Experiment 3 and formed using the mask having a size of (500 nm×500 nm), were caused to perform a resistance changing operation. The applied voltage was 0.4V so that the resistance change did not occur.

As shown in FIG. 5, a difference between the HR and the LR was smaller in the sample (TEOS) including the interlayer insulating layer comprising TEOS than in the sample (Ref) consisting of a single layer. It was presumed that this result was attributed to the fact that the effective element size was reduced and the characteristics were degraded in the sample (TEOS) including the interlayer insulating layer comprising TEOS.

In the sample (FSG) including the interlayer insulating layer comprising FSG, there was no substantial difference between the HR and the LR. It was presumed that this result was attributed to the fact that a reduction of the effective element size and degradation of the characteristics occurred more noticeably in the sample (FSG) including the interlayer insulating layer comprising FSG, because the temperature was higher in the step of depositing FSG (480 degrees C.) than in the step of depositing TEOS (350 degrees C.).

From the results of the above three experiments, it was understood that there caused fluctuation of the characteristics of the non-volatile memory elements stacked together, among the non-volatile memory element layers, and this fluctuation was caused by migration of oxygen due to the heating process.

In view of the above stated findings, the present inventors conceived as follows. That is, by setting the thickness of the second metal oxide layer greater, setting the width of the third metal oxide layer smaller, and forming the oxygen barrier layer around the third metal oxide layer to inhibit oxygen from migrating from the interlayer insulating layer into the third metal oxide layer, just after the corresponding layer in the non-volatile memory element in the lower layer is formed, completed non-volatile memory elements in all non-volatile memory element layers can attain uniform characteristics (initial resistance, a difference in resistance value between the higher-resistance state and the lower-resistance state).

According to one aspect of the present invention, there is provided a method of manufacturing a variable resistance non-volatile memory device including non-volatile memory element layers stacked together by repeating the step of forming a non-volatile memory element layer plural times, the step of forming the non-volatile memory element layer including the steps of: forming a lower electrode layer; forming a variable resistance layer on and above the lower electrode layer; and forming an upper electrode layer on and above the variable resistance layer; and the step of forming the variable resistance layer including the steps of: forming a first metal oxide layer comprising a first metal oxide; and forming a second metal oxide layer comprising a second metal oxide having a higher oxygen content atomic percentage than the first metal oxide; wherein when a thickness of the second metal oxide layer included in each of the non-volatile memory element layers just after the step of forming the corresponding non-volatile memory element layer is completed is a thickness in formation, and when an area of a portion of the second metal oxide layer included in each of the non-volatile memory element layers and a portion of the first metal oxide layer included in the corresponding non-volatile memory element layer, which portions are in contact with each other, just after the step of forming the corresponding non-volatile memory element layer is completed is an area in formation, at least one of the thickness in formation and the area in formation is made different among the steps of forming the non-volatile memory element layers, to cause all of the non-volatile memory elements in a state in which formation of an uppermost non-volatile memory element layer is completed, to have an equal initial resistance.

In this configuration, it becomes possible to suppress fluctuation of element characteristics in a case where non-volatile memory elements each including a variable resistance layer including a plurality of metal oxide layers which are different from each other in oxygen content atomic percentage and are stacked together, are stacked together, more effectively than a conventional configuration.

By diffusion of oxygen including diffusion of oxygen from the second metal oxide layer to the first metal oxide layer, in the steps of forming all of the non-volatile memory element layers, at least one of the thickness in formation and the area in formation may be made different, among the steps of forming the non-volatile memory element layers, to cause all of the non-volatile memory elements in a state in which formation of the uppermost non-volatile memory element layer is completed, to have an equal initial resistance.

The thickness in formation may be greater in the step corresponding to a lower non-volatile memory element layer, among the steps of forming the non-volatile memory element layers.

When the thickness in formation in the step of forming a lower non-volatile memory element layer is D1 and the thickness in formation in the step of forming an upper non-volatile memory element layer is D2, regarding a combination of two steps of forming the non-volatile memory element layers, which occur successively, among the steps of forming the non-volatile memory element layers, $D2<D1<(1.1\times D2)$ may be satisfied.

The step of forming the non-volatile memory element layer may include the step of forming a third metal oxide layer comprising a third metal oxide having a higher oxygen content atomic percentage than the first metal oxide, on an outer peripheral portion of the first metal oxide layer such that the second metal oxide layer is interposed between the first metal oxide layer and the third metal oxide layer, and the electrode.

In the step corresponding to a lower non-volatile memory element layer, among the steps of forming the non-volatile memory element layers, an area of a portion of the third metal oxide layer and a portion of the second metal oxide layer, which portions are in contact with each other, just after the step of forming the corresponding non-volatile memory element layer is completed, may be smaller.

In the step corresponding to a lower non-volatile memory element layer, among the steps of forming the non-volatile memory element layers, an area of the upper electrode layer, just after the step of forming the corresponding non-volatile memory element layer is completed, may be greater.

The step of forming the non-volatile memory element layer may include the step of forming an oxygen barrier layer on a side wall of the variable resistance layer.

In the step corresponding to a lower non-volatile memory element layer, among the steps of forming the non-volatile memory element layers, the area in formation may be greater.

A step accompanied by heating, other than a deposition step and an etching step, may be performed after the step of forming the uppermost non-volatile memory element layer is completed.

According to another aspect of the present invention, there is provided a variable resistance non-volatile memory device comprising non-volatile memory element layers stacked together, each of the non-volatile memory element layers including a lower electrode layer, a variable resistance layer formed on and above the lower electrode layer, and an upper electrode layer formed on and above the variable resistance layer; the variable resistance layer including a first metal oxide layer comprising a first metal oxide, and a second metal oxide layer comprising a second metal oxide having a higher oxygen content atomic percentage than the first metal oxide; when a thickness of the second metal oxide layer included in each of the non-volatile memory element layers just after formation of the corresponding non-volatile memory element layer is completed is a thickness in formation, and when an area of a portion of the second metal oxide layer included in each of the non-volatile memory element layers and a portion of the first metal oxide layer included in the corresponding non-volatile memory element layer, which portions are in contact with each other, just after formation of the corresponding non-volatile memory element layer is completed is an area in formation, at least one of the thickness in formation and the area in formation is made different among the non-volatile memory element layers, to cause all of the non-volatile memory elements to have an equal initial resistance.

In this configuration, it becomes possible to suppress fluctuation of element characteristics in a case where non-volatile memory elements each including a variable resistance layer including a plurality of metal oxide layers which are different from each other in oxygen content atomic percentage and are stacked together, are stacked together, more effectively, than a conventional configuration.

All of the non-volatile memory element layers may be caused to have an equal initial resistance, by diffusion of oxygen including diffusion of oxygen from the second metal oxide layer to the first metal oxide layer, in the steps of forming all of the non-volatile memory element layers.

The thickness in formation may be greater in a lower non-volatile memory element layer.

When the thickness in formation in a lower non-volatile memory element layer is D1 and the thickness in formation in an upper non-volatile memory element layer is D2, regarding a combination of two non-volatile memory element layers which are adjacent to each other, D2<D1<(1.1×D2) may be satisfied.

The variable resistance layer may include a third metal oxide layer comprising a third metal oxide having a higher oxygen content atomic percentage than the first metal oxide, on an outer peripheral portion of the first metal oxide layer; and wherein the second metal oxide layer may be interposed between the first metal oxide layer and the third metal oxide layer, and the electrode.

In a lower non-volatile memory element layer, an area of a portion of the third metal oxide layer and a portion of the second metal oxide layer, which portions are in contact with each other, just after formation of the corresponding non-volatile memory element layer is completed, may be smaller.

In a lower non-volatile memory element layer, an area of the upper electrode layer, just after formation of the corresponding non-volatile memory element layer is completed, may be greater.

The non-volatile memory element layer may include an oxygen barrier layer formed on a side wall of the variable resistance layer.

The area in formation may be greater in a lower variable non-volatile memory element layer.

The variable resistance non-volatile memory device may be obtained by performing a step accompanied by heating, other than a deposition step and an etching step, after formation of an uppermost non-volatile memory element layer is completed.

Hereinafter, embodiments of the present invention will be described with reference to the drawings.

Embodiment 1

Figure 6:
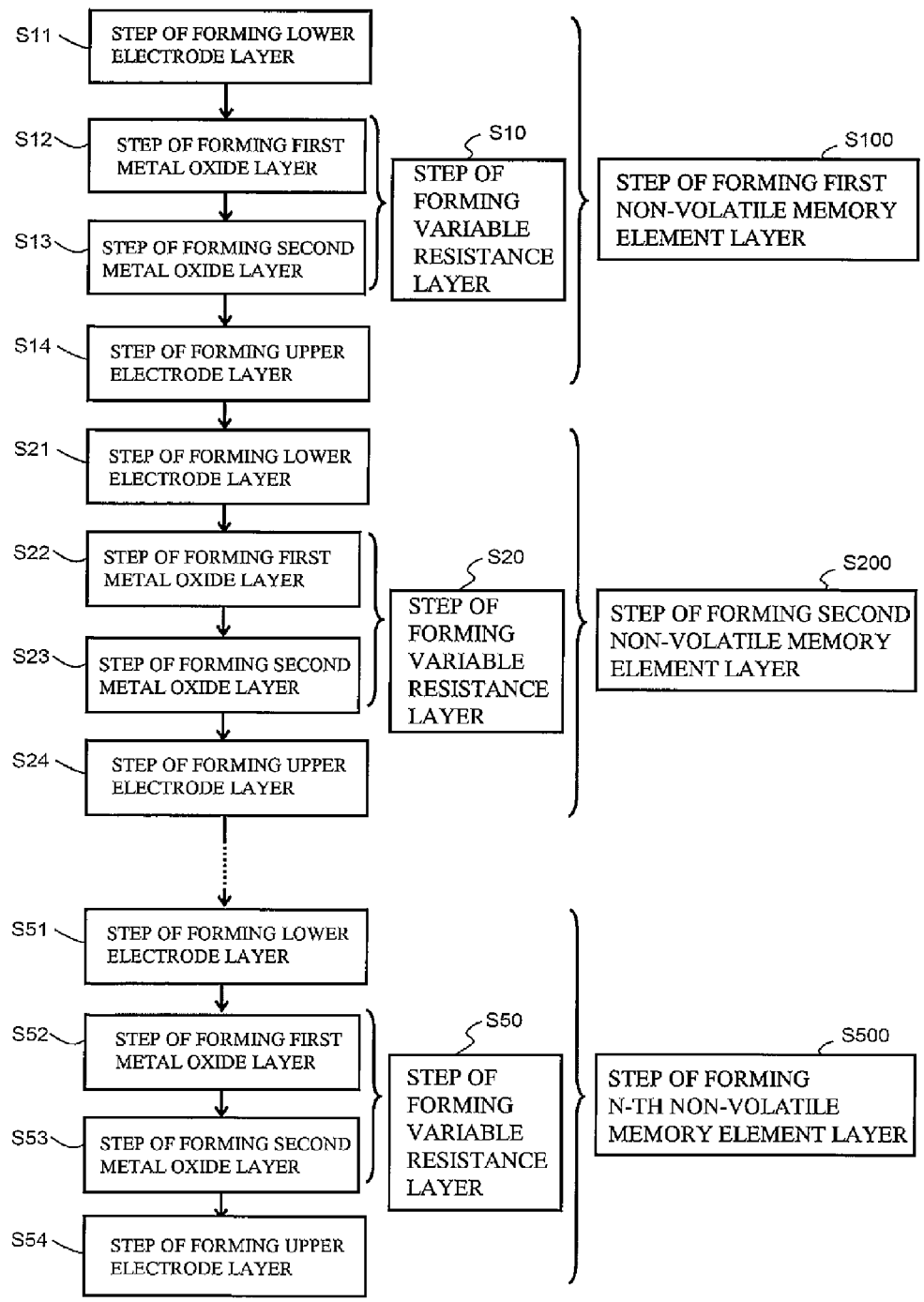
FIG. 6 is a flow chart showing an exemplary manufacturing method of a variable resistance non-volatile memory device according to Embodiment 1.

FIG. 6 is a flow chart showing an exemplary manufacturing method of a variable resistance non-volatile memory device according to Embodiment 1.

As shown in FIG. 6, the manufacturing method of the variable resistance non-volatile memory device according to Embodiment 1 repeats the step (S100, S200 . . . S500) of forming a non-volatile memory element layer plural times. In the example of FIG. 6, the step of forming the non-volatile memory element layer N times. N may be a natural number of 2 or more.

The step of forming the non-volatile memory element layer includes the step (S11, S21, . . . S51) of forming a lower electrode layer, the step (S10, S20, . . . S50) of forming a variable resistance layer on and above the lower electrode layer, and the step (S14, S24, . . . S54) of forming an upper electrode layer on and above the variable resistance layer.

The variable resistance layer is a layer which is interposed between the lower electrode layer and the upper electrode layer, and which changes its resistance value reversibly in response to an electric signal applied between the lower electrode layer and the upper electrode layer. For example, the variable resistance layer is a layer which reversibly changes its resistance state between a higher-resistance state and a lower-resistance state according to a polarity of a voltage applied between the lower electrode layer and the upper electrode layer.

The step of forming the variable resistance layer includes the step (S12, S22, . . . S52) of forming a first metal oxide layer comprising a first metal oxide, and the step (S13, S23, . . . S53) of forming a second metal oxide layer comprising a second metal oxide having a higher oxygen content atomic percentage than the first metal oxide.

The first metal oxide is preferably an oxygen-deficient metal oxide. The oxygen-deficient metal oxide refers an oxide having a lower oxygen content atomic percentage than an oxide having a stoichiometric composition.

The second metal oxide layer has a small localized region in which a degree of oxygen deficiency changes reversibly in response to the electric pulse applied. It may be considered that the localized region includes a filament formed by oxygen defective sites.

The "degree of oxygen deficiency" refers to a rate of deficient oxygen with respect to an amount of oxygen constituting a metal oxide having a stoichiometric composition (stoichiometric composition corresponding to a highest resistance value in a case of a plurality of stoichiometric compositions exist). The metal oxide having the stoichiometric composition is more stable and has a higher resistance value than a metal oxide having another composition.

For example, in the case where the metal is tantalum (Ta), its oxide having the stoichiometric composition according to the above definition is $Ta_2O_5$, and therefore, can be expressed as $TaO_{2.5}$. The degree of oxygen deficiency of $TaO_{2.5}$ is 0%. The degree of oxygen deficiency of $TaO_{1.5}$ is $(2.5-1.5)/2.5=40\%$. A degree of oxygen deficiency of a metal oxide which is excess in oxygen has a negative value. In the present specification, the degree of oxygen deficiency may include a positive value, 0, and a negative value, except for cases specifically described.

An oxide which is smaller in the degree of oxygen deficiency is closer to the oxide having the stoichiometric composition, and therefore, its resistance value is greater. An oxide which is greater in the degree of oxygen deficiency is closer to a metal constituting the oxide, and therefore, its resistance value is smaller.

The "oxygen content atomic percentage" is defined as a ratio of oxygen atom number with respect to a total atom number constituting an oxide. There exist an oxide having a plurality of stoichiometric compositions. Herein, the stoichiometric composition is defined as a composition which provides a highest resistivity and typically exhibits insulating properties. Depending on process conditions in formation of a metal oxide, oxygen which is more in amount than oxygen in the stoichiometric composition may be introduced into the metal oxide (e.g., interstitial site, etc.).

For example, the oxygen content atomic percentage of $Ta_2O_5$ is a ratio of oxygen atom number with respect to a total atom number (O/(Ta+O)), and $5/(2+5)=71.4$ atm %. Therefore, the oxygen content atomic percentage of the tantalum oxide is greater than 0 and smaller than 71.4 atm %. For example, when a metal constituting the first metal oxide layer and a metal constituting the second metal oxide layer are of the same kind, their oxygen content atomic percentages correspond to degrees of deficiency of oxygen. That is, when the oxygen content atomic percentage of the second metal oxide is greater than the oxygen content atomic percentage of the first metal oxide, the degree of oxygen deficiency of the second metal oxide is smaller than the degree of oxygen deficiency of the first metal oxide.

The kind of the first metal oxide and the kind of the second metal oxide are not particularly limited. As the metal constituting the first metal oxide and the metal constituting the second metal oxide, a transition metal, aluminum (Al) and the like may be used. As the transition metal, tantalum (Ta), titanium (Ti), hafnium (Hf), zirconium (Zr), niobium (Nb), tungsten (W), nickel (Ni), and the like may be used. Since the transition metal is able to have a plurality of oxidized states, it can realize different resistance states by a redox reaction. Specifically, for example, at least one metal oxide selected from the group consisting of a tantalum oxide, a hafnium oxide, and a zirconium oxide, may be used. When the tantalum oxide is used as the metal oxide, and the first metal oxide is expressed as $TaO_x$ (x: number of atoms of O when number of atoms of Ta is 1), $0.8 \leq x \leq 1.9$ may be satisfied.

In a case where the second metal oxide and the first metal oxide are oxides of the same metal, the second metal oxide comprises a metal oxide having a higher oxygen content atomic percentage than the first metal oxide. In this case, the oxygen content atomic percentage is not particularly limited. For example, the oxygen content atomic percentage may be of a metal oxide which is an insulator.

In a case where the tantalum oxide is used as the first metal oxide and the second metal oxide, when the first metal oxide is expressed as $TaO_x$ (x: number of atoms of 0 when number of atoms of Ta is 1), and the second metal oxide is expressed as $TaO_y$ (y: number of atoms of 0 when number of atoms of Ta is 1), $x<y$ may be satisfied.

The first metal constituting the first metal oxide and the second metal constituting the second metal oxide may be different metals. In this case, the second metal oxide may have a smaller degree of oxygen deficiency, i.e., having a higher resistance than the first metal oxide. In this configuration, a larger portion of a voltage applied between the lower electrode layer and the upper electrode layer to cause resistance change is fed to the second metal oxide, which facilitates proceeding of a redox reaction in the second metal oxide.

In a case where different materials are used as the first metal and the second metal, the second metal may have a lower standard electrode potential than the first metal. As a value of the standard electrode potential is greater, oxidation of the corresponding metal takes place less easily. This allows the redox reaction to take place easily in the second metal oxide having a relatively lower standard electrode potential.

It is presumed that a resistance changing phenomenon occurs in such a manner that a filament (electric conductive path) changes due to the redox reaction taking place in a small localized region formed in the second metal oxide layer having a higher resistance, and thereby a resistance value (degree of oxygen deficiency) in the localized region changes.

For example, if the tantalum oxide is used as the first metal oxide and titanium oxide ($TiO_2$) is used as the second metal oxide, a stable resistance changing operation occurs. Titanium (standard electrode potential=−1.63 eV) has a lower standard electrode potential than tantalum (standard electrode potential=−0.6 eV).

By using as the second metal oxide, the oxide of the metal having a lower standard electrode potential than the first metal oxide, the redox reaction takes place in the second metal oxide more easily.

In another combination, aluminum oxide ($Al_2O_3$) may be used as the second metal oxide. For example, the tantalum oxide ($TaO_x$) may be used as the first metal oxide and the aluminum oxide ($Al_2O_3$) may be used as the second metal oxide.

It is presumed that the resistance changing phenomenon in the variable resistance layer having the above stated stacked-layer structure occurs in such a manner that the filament (electric conductive path) in the small localized region changes due to the redox reaction taking place in the localized region formed in the second metal oxide layer having a higher resistance, and thereby a resistance value in the localized region changes.

That is, the following presumption may be made. When a positive voltage is applied to the upper electrode layer connected to the second metal oxide layer on the basis of the lower electrode layer, oxygen ions in the variable resistance layer are drawn toward the second metal oxide layer. This causes an oxidation reaction to proceed in the small localized region formed in the second metal oxide layer, so that the degree of oxygen deficiency decreases. As a result, the filament in the localized region is likely to be disconnected, and the resistance value in the localized region increases.

On the other hand, when a negative voltage is applied to the upper electrode layer connected to the second metal oxide layer on the basis of the lower electrode layer, oxygen ions in the second metal oxide layer are pushed toward the first metal oxide layer. This causes the redox reaction to proceed in the small localized region formed in the second metal oxide layer, so that the degree of oxygen deficiency increases. As a result, the filament in the localized region is likely to be connected easily, and the resistance value in the localized region decreases.

A vertical positional relationship between the first metal oxide layer and the second metal oxide layer is not particularly limited. The second metal oxide layer may be formed on and above the first metal oxide layer. Or, the first metal oxide layer may be formed on and above the second metal oxide layer.

The first metal oxide layer may be formed by, for example, sputtering, CVD, ALD and the like. The second metal oxide layer may be formed by, for example, sputtering, CVD, ALD, and the like. When the second metal oxide layer is formed on and above the first metal oxide layer, it may be formed by oxidizing an upper portion of the first metal oxide layer using plasma, oxygen gas, etc.

A material of the upper electrode layer is not particularly limited. Specifically, when the upper electrode layer and the second metal oxide layer which is lower in degree of oxygen deficiency are in contact with each other, it is preferable that the upper electrode layer comprises a material having a higher standard electrode potential than a material constituting the lower electrode layer located under the variable resistance layer and the metal constituting the second metal oxide. For example, the material of the upper electrode layer may be at least one material selected from the group consisting of iridium (Ir), platinum (Pt), palladium (Pd), gold (Au), copper (Cu), and silver (Ag).

The lower electrode layer connected to the first metal oxide which is higher in degree of oxygen deficiency may be, for example, tungsten (W), nickel (Ni), tantalum (Ta), titanium (Ti), aluminum (Al), tantalum nitride (TaN), titanium nitride (TiN), etc. The lower electrode layer may comprise a material having a lower standard electrode potential than the metal constituting the first metal oxide.

A standard electrode potential V2 of a material constituting the upper electrode layer, a standard electrode potential Vr2 of metal constituting the second metal oxide, a standard electrode potential Vr1 of metal constituting the first metal oxide, and a standard electrode potential V1 of a material constituting the lower electrode layer may satisfy a relationship of Vr2<V2 and V1<V2 may be satisfied. In addition, a relationship of V2>Vr2 and Vr1≥V1 may be satisfied.

In this configuration, the redox reaction takes place selectively in a portion of the second metal oxide layer which is present in the vicinity of an interface between the upper electrode layer and the second metal oxide layer, thereby enabling a stable resistance changing phenomenon to take place.

The upper electrode layer may be formed by sputtering, CVD (chemical vapor deposition), ALD (atomic layer deposition), and the like.

In some cases, actual step may include the step of forming the interlayer insulating layer, the wire, the via, and the like. However, these steps are used in normal semiconductor process step and therefore are not depicted in FIG. 6.

The upper electrode layer may be used as the lower electrode layer in the upper non-volatile memory element layer. In this case, the step (S11, S21, ... S51) of forming the lower electrode layer may be identical to the step (S14, S24, ... S54) of forming the upper electrode layer. At least one of the upper electrode layer and the lower electrode layer may be used as the wire layer. The upper electrode layer and the lower electrode layer may be an identical constituent, which may be used as the wire layer. The above recitation may be applied to another embodiments and modified examples.

In a case where the upper electrode layer and the second metal oxide layer are in contact with each other, the lower electrode layer and the first metal oxide layer are in contact with each other, and the lower electrode layer and the upper electrode layer are formed as separate constituents, it is preferable that the lower electrode layer comprises an electrode material comprising as a major component a material (e.g., TaN (tantalum nitride), etc.) having a lower standard electrode potential than the upper electrode layer. Specifically, when each of the first metal oxide and the second metal oxide comprises the tantalum oxide, the lower electrode layer may comprise a material selected from the group consisting of TaN, W, Ni, Ta, Ti, Al, etc., and the upper electrode layer may comprise a material selected from the group consisting of Pt, Ir, Pd, Ag, Cu, Au, etc. In this configuration, the redox reaction takes place selectively in a portion of the second metal oxide layer which is present in the vicinity of an interface between the upper electrode layer and the second metal oxide layer, thereby enabling a stable resistance changing phenomenon to take place.

In a case where the upper electrode layer and the first metal oxide layer are in contact with each other, the lower electrode layer and the second metal oxide layer are in contact with each other, and the lower electrode layer and the upper electrode layer are formed as separate constituents, it is preferable that the lower electrode layer comprises a material having a higher standard electrode potential than the material constituting the upper electrode layer and the second metal oxide, and the upper electrode comprises an electrode material comprising as a major component a material (e.g., TaN (tantalum nitride), etc.) having a lower standard electrode potential than the lower electrode layer. Specifically, when each of the first metal oxide and the second metal oxide comprises the tantalum oxide, the upper electrode layer may preferably comprise a material selected from the group consisting of TaN, W, Ni, Ta, Ti, Al, etc., and the lower electrode layer may preferably comprise a material selected from the group consisting of Pt, Ir, Pd, Ag, Cu, Au, etc. In this configuration, the redox reaction takes place selectively in a portion of the second metal oxide layer which is present in the vicinity of an interface between the lower electrode layer and the second metal oxide layer, thereby enabling a stable resistance changing phenomenon to take place.

The lower electrode layer may be formed by sputtering, CVD (chemical vapor deposition), ALD (atomic layer deposition), and the like.

The lower electrode layers in different non-volatile memory element layers may comprise the same material or different materials. The first metal oxide layers in different non-volatile memory element layers may comprise the same material or different materials. The second metal oxide layers in different non-volatile memory element layers may comprise the same material or different materials. The upper electrode layers in different non-volatile memory element layers may comprise the same material or different materials.

A thickness of the second metal oxide layer in each of non-volatile memory element layers just after the step of forming the corresponding non-volatile memory element layer is completed will be hereinafter referred to as "thickness in formation."

In the manufacturing method of the variable resistance non-volatile memory device according to Embodiment 1, the thickness in formation is made different, among the steps of forming the non-volatile memory element layers, to cause all of the non-volatile memory elements in a state in which formation of the uppermost non-volatile memory element layer is completed, to have an equal initial resistance.

The term "have an equal initial resistance" means that the initial resistances of all of the non-volatile memory elements substantially match at a level at which no problem occurs in practice of the variable resistance non-volatile memory device, i.e., the initial resistances fall within an allowable range in practice of the variable resistance non-volatile memory device.

In a case where non-volatile memory elements each including a variable resistance layer including a plurality of metal oxide layers which are different from each other in oxygen content atomic percentage and are stacked together, are stacked together, heat budget (accumulated heating amount) is made different among the non-volatile memory element layers, which may result in fluctuation of the oxygen profiles and hence fluctuation of the element characteristics. In the variable resistance non-volatile memory device and the manufacturing method thereof of the present embodiment, by adjusting the thickness of the second metal oxide layer (layer with a higher oxygen content atomic percentage: higher-resistance layer), which would directly affect the initial resistance, the characteristics of the cells in a completed state of the device can be made uniform. Therefore, it becomes possible to provide a variable resistance non-volatile memory device which is uniform in the resistance changing characteristics. As a result, the memory having a more layers and a greater capacity can be implemented easily.

The thickness in formation may be greater in the step corresponding to a lower non-volatile memory element layer, among the steps of forming the non-volatile memory element layers.

When the thickness in formation in the step of forming a lower non-volatile memory element layer is D1 and the thickness in formation in the step of forming an upper non-volatile memory element layer is D2, regarding any one of all combinations of two steps of forming the non-volatile memory element layers, which occur successively, among the steps of forming the non-volatile memory element layers, $D2 < D1 < (1.1 \times D2)$ may be satisfied.

In accordance with this configuration, fluctuation of diffusion of oxygen can be lessened to a certain level or less, which makes it easier to make the element characteristics uniform.

The element included in the non-volatile memory device of the present embodiment, i.e., the non-volatile memory element may be formed in such a manner that after the corresponding layers are stacked together, they are patterned. Or, the layers may be sequentially formed inside of a through-hole formed in the interlayer insulating layer. Or, a portion of the plurality of layers may be formed outside of the through-hole and another portion may be formed inside of the through-hole.

The step of forming the variable resistance layer and the step of forming the upper electrode layer on and above the variable resistance layer may be performed successively, or another step may inserted between these steps. Moreover, portions of these steps may overlap with each other.

In a configuration in which the lower electrode layer, the first metal oxide layer, the second metal oxide layer and the upper electrode layer are stacked in this order, another layer may intervene between the layers. For example, in a case where the second metal oxide layer is formed on and above the first metal oxide layer, another metal oxide layer comprising a metal oxide having an oxygen content atomic percentage different from that of the first metal oxide may be formed between the lower electrode layer and the first metal oxide layer. Or, for example, in the case where the second metal oxide layer is formed on and above the first metal oxide layer, another metal oxide layer comprising a metal oxide having an oxygen content atomic percentage different from that of the second metal oxide may be formed between the second metal oxide layer and the upper electrode layer.

Example 1

FIGS. 7A to 7L are views showing the steps of a manufacturing method of the variable resistance non-volatile memory device according to Example 1 of Embodiment 1. With reference to FIGS. 7A to 7L, the manufacturing method of the present example will be described.

Figure 7A:
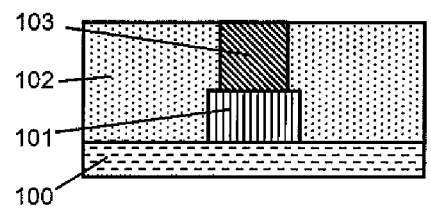
FIG. 7A is a view showing the step of forming on and above a substrate, a first wire, a first interlayer insulating layer, and a first contact plug in Example 1 of Embodiment 1.

FIG. 7A is a view showing the step of forming on and above the substrate, the first wire, the first interlayer insulating layer, and the first contact plug in Example 1 of Embodiment 1.

As the substrate 100, for example, a silicon substrate is used. The first wire 101 comprises, for example, aluminum. The first wire 101 may be formed in such a manner that after a first wire material layer (thickness: 400 to 600 nm) is deposited by, for example, sputtering, it is processed to have a desired shape by patterning using a desired mask and by dry etching. Specifically, for example, the width of the first wire 101 may be 0.25 μm and the thickness of the first wire 101 may be 450 nm.

On the substrate 100, the first interlayer insulating layer 102 is formed such that it covers the first wire 101. The first interlayer insulating layer 102 comprises, for example, TEOS. The first interlayer insulating layer 102 is deposited by, for example, the CVD, and is planarized by CMP. Specifically, for example, the thickness of the first interlayer insulating layer 102 may be, for example, 500 to 1000 nm. As a material of the interlayer insulating layer 102, a silicon oxide may be used. Or, to reduce a parasitic capacitance between wires, low-k material (low-dielectric material) such as a fluorine-containing oxide (e.g., FSG) is suitably used, as the material of the first interlayer insulating layer 102.

A first contact hole is formed in the first interlayer insulating layer 102 such that it penetrates the first interlayer insulating layer 102 and exposes the first wire 101. The first contact hole is formed by, for example, patterning using a desired mask and by dry-etching. Specifically, for example, a diameter of the first contact hole may be 50 to 300 nm. The diameter of the first contact hole is preferably smaller than the width of the first wire 101. According to this configuration, even if mask misalignment occurs during the patterning, a contact area of a portion of the first wire 101 and a portion of the first contact plug 103, which portions are in contact with each other can be made uniform. As a result, it becomes possible to suppress fluctuation of cell currents which would be caused by fluctuation of the contact areas.

An electrically-conductive material layer is deposed to fill the first contact hole. A portion of the electrically-conductive material layer which is located above an upper end surface of the first interlayer insulating layer 102 is removed, thereby forming the first contact plug 103.

The electrically-conductive material layer may be formed by, for example, the method described below. Firstly, a titanium nitride layer (TiN layer) serving as a diffusion barrier is deposited with a thickness of 5 to 30 nm by sputtering. Then, a titanium layer (Ti layer) serving as an adhesive layer is deposited with a thickness of 5 to 30 nm by CVD. Then, tungsten which becomes a major constituent of the contact plug is deposited with a thickness of 200 to 400 nm by CVD. In this way, the first contact hole is filled with the electrically-conductive material layer having a stacked-layer structure (W/Ti/TiN structure). The electrically-conductive material is removed by, for example, CMP.

Figure 7B:
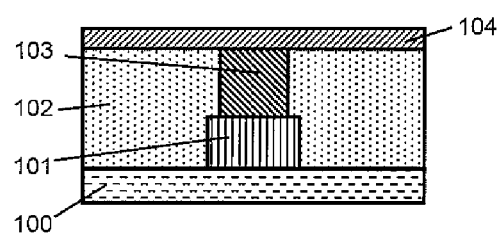
FIG. 7B is a view showing the step of forming a lower electrode layer in a first non-volatile memory element layer such that the lower electrode layer covers the first contact plug, in Example 1 of Embodiment 1.

FIG. 7B is a view showing the step of forming the lower electrode layer in the first non-volatile memory element layer such that the lower electrode layer covers the first contact plug, in Example 1 of Embodiment 1. The lower electrode layer 104 in the first non-volatile memory element layer may comprise, for example, tantalum nitride (TaN). The lower electrode layer 104 may be deposited by, for example, sputtering. A thickness of the lower electrode layer 104 may be, for example, 20 to 50 nm.

Figure 7C:
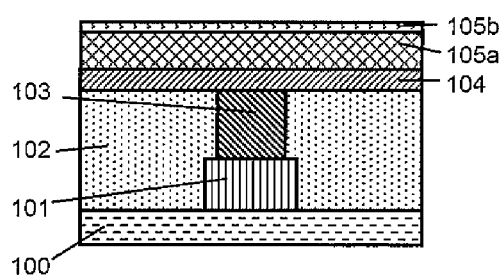
FIG. 7C is a view showing the step of forming on and above the lower electrode layer, a first metal oxide layer in the first non-volatile memory element layer and a second metal oxide layer in the first non-volatile memory element layer, in this order, in Example 1 of Embodiment 1.

FIG. 7C is a view showing the step of forming on and above the lower electrode layer, the first metal oxide layer in the first non-volatile memory element layer and the second metal oxide layer in the first non-volatile memory element layer, in this order, in Example 1 of Embodiment 1.

The first metal oxide layer 105a may comprise $TaO_x$ ($0.8 \leq x \leq 1.9$). The first metal oxide layer 105a is deposited by reactive sputtering in which sputtering is performed using, for example, a target comprising tantalum, in an atmosphere containing oxygen. An oxygen content atomic percentage of the first metal oxide layer 105a may be not less than 44 atm % and not more than 66 atm %. A resistivity of the first metal oxide layer 105a may be not less than 0.2 mΩ cm and not more than 50 mΩ cm. A thickness of the first metal oxide layer 105a may be not less than 20 nm and not more than 100 nm, which is a measurement value obtained using spectroscopic ellipsometry.

For example, conditions of the reactive sputtering may be set such that a power supply output is 1000 W, a deposition pressure is 0.05 Pa, an argon flow rate is 20 sccm, and an oxygen gas flow rate is 21 sccm.

The second metal oxide layer 105b comprises, for example, $Ta_2O_5$. The second metal oxide layer 105b may be deposited by sputtering using, for example, a target comprising tantalum oxide ($Ta_2O_5$). An oxygen content atomic percentage of the second metal oxide layer 105b may be not less than 67 atm % and not more than 72 atm %. A resistivity of the first metal oxide layer 105a may be not less than $10^7$ mΩcm. A thickness of the second metal oxide layer 105b may be not less than 3 nm and not more than 10 nm.

Like the first metal oxide layer 105a, the second metal oxide layer 105b may be deposited by the reactive sputtering. Or, the second metal oxide layer 105b may be formed by plasma oxidation in which an upper portion of the first metal oxide layer 105a is treated by oxygen plasma. For example, conditions of the plasma oxidation may be such that a RF power supply output is 50 W, a substrate temperature is 270 degrees C., and an $O_2$ flow rate is 0.3 SLM. In this case, the second metal oxide layer 106b may be configured to have a composition which is close to $Ta_2O_5$ (oxygen content atomic percentage=71.4%), which is an insulating substance.

In the present example, the first metal oxide layer 105a and the second metal oxide layer 105b constitute a variable resistance layer 105.

Figure 7D:
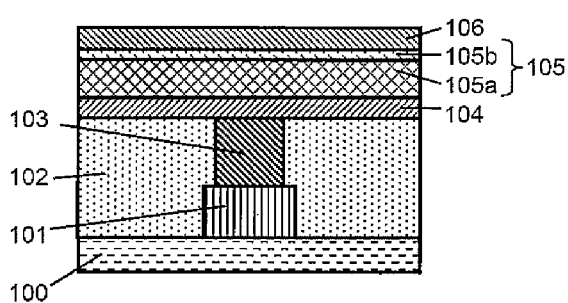
FIG. 7D is a view showing the step of forming an upper electrode layer in the first non-volatile memory element layer, on and above the second metal oxide layer, in Example 1 of Embodiment 1.

FIG. 7D is a view showing the step of forming the upper electrode layer in the first non-volatile memory element layer on and above the second metal oxide layer, in Example 1 of Embodiment 1. The upper electrode layer 106 may comprise, for example, iridium (Ir). The upper electrode layer 106 in the first non-volatile memory element layer is deposited by, for example, sputtering. A thickness of the upper electrode layer 106 may be, for example, 80 nm.

Figure 7E:
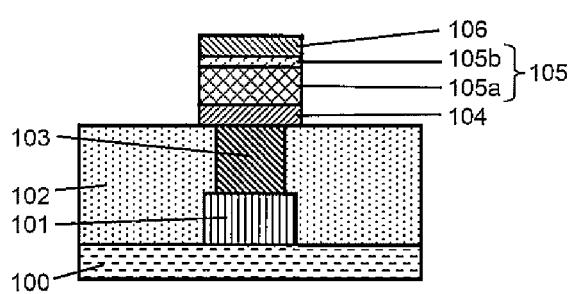
FIG. 7E is a view showing the step of forming a non-volatile memory element in the first non-volatile memory element layer by patterning, in Example 1 of Embodiment 1.

FIG. 7E is a view showing the step of forming the non-volatile memory element in the first non-volatile memory element layer by patterning, in Example 1 of Embodiment 1.

Specifically, for example, the lower electrode layer 104, the first metal oxide layer 105*a*, the second metal oxide layer 105*b* and the upper electrode layer 106 are patterned using desired mask(s) and by dry etching, thereby forming the non-volatile memory element. The non-volatile memory element may have, for example, a square shape having a side with a length of 100 to 500 nm, when viewed from a thickness direction of the substrate (when viewed from above).

The lower electrode layer 104, the first metal oxide layer 105*a*, the second metal oxide layer 105*b* and the upper electrode layer 106 may be patterned together using the same mask, or individually for each layer.

Figure 7F:
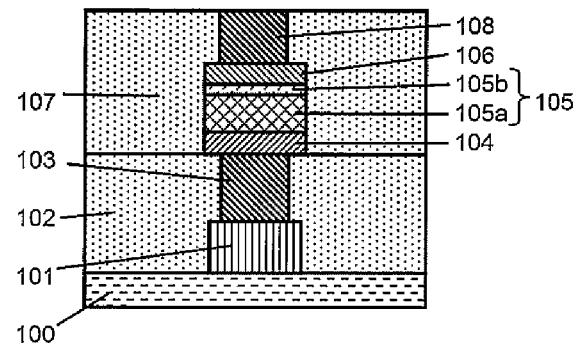
FIG. 7F is view showing the step of forming a second interlayer insulating layer and a second contact plug on and above the non-volatile memory element, in Example 1 of Embodiment 1.

FIG. 7F is a view showing the step of forming the second interlayer insulating layer and the second contact plug on and above the non-volatile memory element, in Example 1 of Embodiment 1.

The second interlayer insulating layer 107 may be configured like the first interlayer insulating layer 102 and formed in the same method as that for the first interlayer insulating layer 102. To mitigate a residual stress in the second interlayer insulating layer 107 and remove a residual moisture from the second interlayer insulating layer 107, after forming the second interlayer insulating layer 107, the second interlayer insulating layer 107 may be thermally treated for 10 minutes, for example, in a heating furnace heated up to 400 degrees C. Preferably, such a heating process may be performed collectively for all of the non-volatile memory element layers, after formation of an uppermost non-volatile memory element layer is completed.

The second contact plug 108 may be configured like the first contact plug 103 and formed in the same method.

Figure 7G:
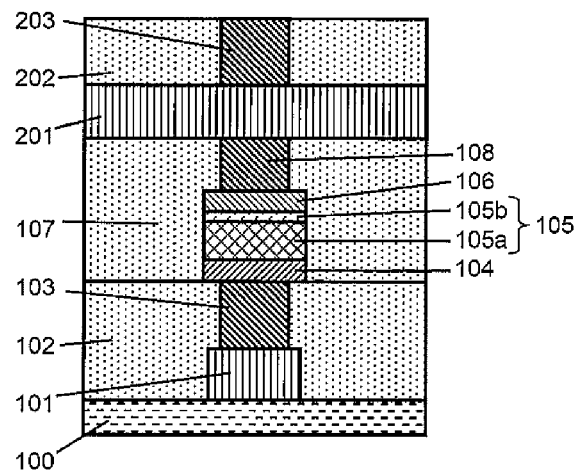
FIG. 7G is a view showing the step of forming a second wire, a third interlayer insulating layer and a third contact plug, on and above the second contact plug, in Example 1 of Embodiment 1.

FIG. 7G is a view showing the step of forming the second wire, the third interlayer insulating layer and the third contact plug on and above the second contact plug, in Example 1 of Embodiment 1.

The second wire 201, the third interlayer insulating layer 202, and the third contact plug 203 may be configured like the first wire 101, the first interlayer insulating layer 102, and the first contact plug 103, respectively, and formed in the same method as that for the first wire 101, the first interlayer insulating layer 102, and the first contact plug 103. Note that the second wire 201 and the first wire 101 may extend so as to cross each other when viewed from the thickness direction of the substrate 100.

Figure 7H:
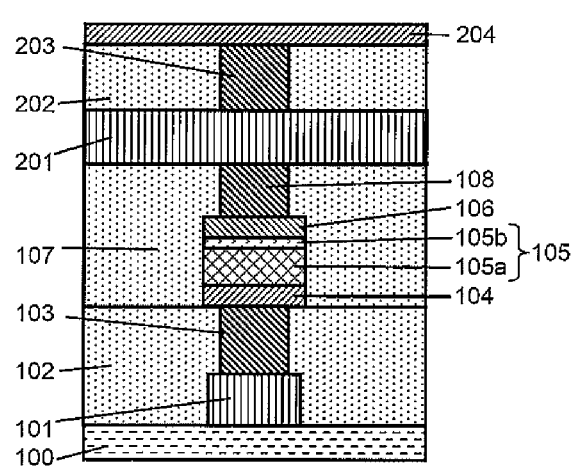
FIG. 7H is a view showing the step of forming a lower electrode layer in a second non-volatile memory element layer such that the lower electrode layer covers the third contact plug, in Example 1 of Embodiment 1.

FIG. 7H is a view showing the step of forming the lower electrode layer in the second non-volatile memory element layer such that the lower electrode layer covers the third contact plug, in Example 1 of Embodiment 1. The lower electrode layer 204 in the second non-volatile memory element layer may be configured like the lower electrode layer 104 in the first non-volatile memory element layer and formed in the same method as that for the lower electrode layer 104.

Figure 7I:
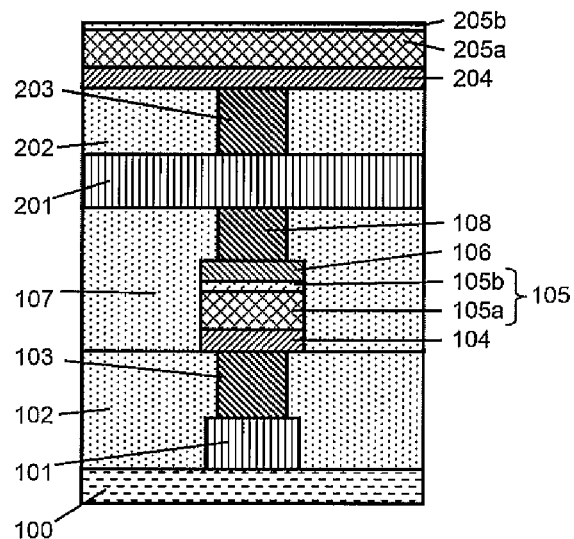
FIG. 7I is a view showing the step of forming on and above the lower electrode layer, a first metal oxide layer in the second non-volatile memory element layer and a second metal oxide layer in the second non-volatile memory element layer, in this order, in Example 1 of Embodiment 1.

FIG. 7I is a view showing the step of forming on and above the lower electrode layer, the first metal oxide layer in the second non-volatile memory element layer and the second metal oxide layer in the second non-volatile memory element layer, in this order, in Example 1 of Embodiment 1. The first metal oxide layer 205*a* in the second non-volatile memory element layer and the second metal oxide layer 205*b* in the second non-volatile memory element layer may be configured like the first metal oxide layer 105*a* in the first non-volatile memory element layer and the second metal oxide layer 105*b* in the first non-volatile memory element layer, respectively, and formed in the same method as that the first metal oxide layer 105*a* and the second metal oxide layer 105*b*, except for the thickness.

In the step of FIG. 7I, for example, the second metal oxide layer 205*b* is made 1.2 nm thinner than the second metal oxide layer 105*b*. This allows the second metal oxide layer 105*b* in the first non-volatile memory element layer and the second metal oxide layer 205*b* in the second non-volatile memory element layer to have a substantially equal thickness after formation of the second non-volatile memory element layer is completed (see Experiment 4).

Figure 7J:
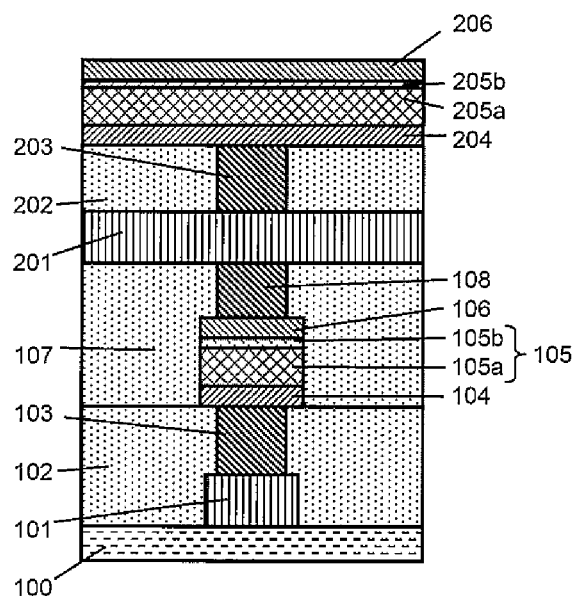
FIG. 7J is a view showing the step of forming an upper electrode layer in the second non-volatile memory element layer on and above the second metal oxide layer, in Example 1 of Embodiment 1.

FIG. 7J is a view showing the step of forming the upper electrode layer in the second non-volatile memory element layer on and above the second metal oxide layer, in Example 1 of Embodiment 1. The upper electrode layer 206 in the second non-volatile memory element layer may be configured like the upper electrode layer 106 in the first non-volatile memory element layer and may be formed in the same method as that for the upper electrode layer 106.

Figure 7K:
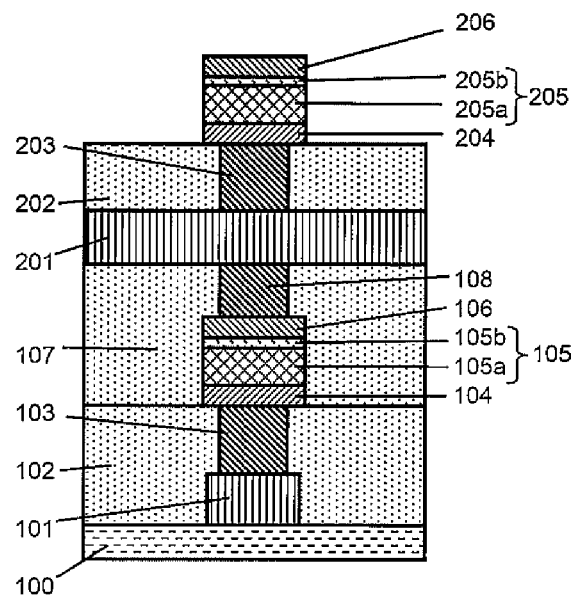
FIG. 7K is a view showing the step of forming a non-volatile memory element in the second non-volatile memory element layer, by patterning, in Example 1 of Embodiment 1.

FIG. 7K is a view showing the step of forming the non-volatile memory element in the second non-volatile memory element layer, by patterning, in Example 1 of Embodiment 1. This patterning may be performed in the same method as that in the case where the non-volatile memory element in the first non-volatile memory element layer is formed.

Figure 7L:
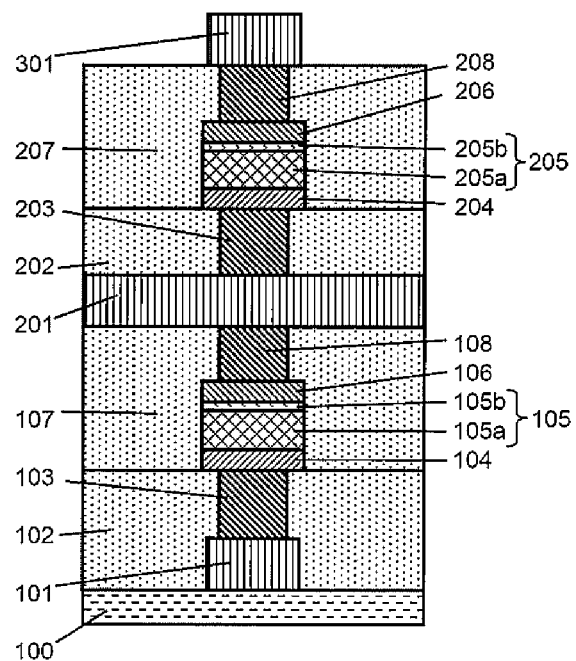
FIG. 7L is a view showing the step of forming a fourth interlayer insulating layer, a fourth contact plug, and a third wire on and above the non-volatile memory element, in Example 1 of Embodiment 1.

FIG. 7L is a view showing the step of forming a fourth interlayer insulating layer, a fourth contact plug, and a third wire on and above the non-volatile memory element, in Example 1 of Embodiment 1. The fourth interlayer insulating layer, the fourth contact plug, and the third wire may be configured like the first interlayer insulating layer 102, the first contact plug 103, and the first wire 101, respectively, and may be formed in the same method.

By the above described method, a cross-point variable resistance memory device having the two non-volatile memory element layers is manufactured.

As described above, at a time point when the step of FIG. 7I is completed, the second metal oxide layer 105*b* in the first non-volatile memory element layer and the second metal oxide layer 205*b* in the second non-volatile memory element layer are caused to have a substantially equal thickness. However, for example, in a case where heating influence occurring thereafter is varied from layer to layer, the second metal oxide layer 105*b* in the first non-volatile memory element layer and the second metal oxide layer 205*b* in the second non-volatile memory element layer may be caused to have a substantially equal thickness, at a time point when any of the step of FIG. 7J, the step of FIG. 7K and the step of FIG. 7L is completed. In any cases, it is desired that the second metal oxide layers in all of the non-volatile memory element layers have a substantially equal thickness at a time point when formation of the uppermost non-volatile memory element layer is completed.

The steps of FIGS. 7B to 7E correspond to the step (S100 of FIG. 6) of forming the first non-volatile memory element layer. The steps of FIGS. 7H to 7K correspond to the step (S200 of FIG. 6) of forming the second non-volatile memory element layer. The steps of FIGS. 7B and 7H correspond to the step (S11, S21 of FIG. 6) of forming the lower electrode layer. The steps of FIGS. 7C and 7I correspond to the step (S10, S20 of FIG. 6) of forming the variable resistance layer. The steps of FIGS. 7D and 7J correspond to the step (S14, S24 of FIG. 6) of forming the upper electrode layer.

After the step of FIG. 7L, the step of forming the interlayer insulating layer and the contact plug, of the step of FIG. 7A, the steps of FIGS. 7B to 7F, and the step of forming the wire, of the step of FIG. 7G; may be performed again, to manufacture a variable resistance memory device including a third non-volatile memory element layer. In addition, the step of forming the interlayer insulating layer and the contact plug, of the step of FIG. 7G; and the steps of FIGS. 7H to 7L may be performed again, to manufacture a variable resistance memory device including a fourth non-volatile memory element layer. After that, in the same method, a variable resistance memory device including five or more non-volatile memory element layers can be manufactured.

Experiment 4

In Experiment 4, regarding samples created in a method similar to that of the sample (TEOS) including the interlayer insulating layer comprising TEOS in Experiment 3, in such a manner that only the thickness of the second metal oxide layer included in each of the non-volatile memory element layers just after completing the step of forming the corresponding non-volatile memory element layer, i.e., the thickness in formation, was made different among the non-volatile memory element layers, initial resistance of the non-volatile memory element in the first non-volatile memory element layer and initial resistance of the non-volatile memory element in the second non-volatile memory element layer were compared to each other.

Figure 8:
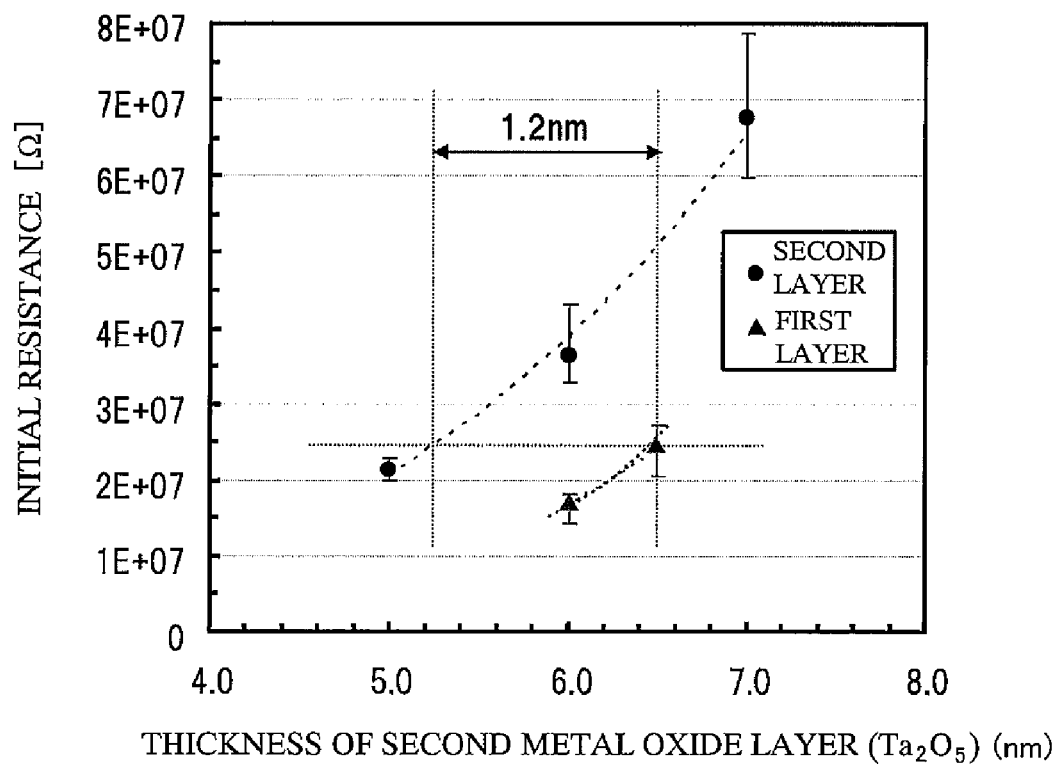
FIG. 8 is a view of a result of Experiment 4.

FIG. 8 is a view of a result of Experiment 4. As shown in FIG. 8, the initial resistance was lower in the first non-volatile memory element layer (lower layer) than in the second non-volatile memory element layer (upper layer). More specifically, when the thickness of the second metal oxide layers was equal and 6 nm, the initial resistance of the non-volatile memory element in the first layer was about $1.7 \times 10^7 \Omega$, while the initial resistance of the non-volatile memory element in the second layer was about $3.6 \times 10^7 \Omega$.

This result implied that oxygen diffused from the second metal oxide layer 105b to the first metal oxide layer 105a in the first non-volatile memory element layer, due to heating conducted when the second non-volatile memory element layer was formed, and as a result, the second metal oxide layer 105b was thinned.

A distance between two curves created by fitting the first non-volatile memory element layer and the second non-volatile memory element layer was 1.2 nm. From this, by setting the thickness in formation in the first non-volatile memory element layer greater than the thickness in formation in the second non-volatile memory element layer by 1.2 nm, all of the non-volatile memory elements (the non-volatile memory element in the first non-volatile memory element layer and the non-volatile memory element in the second non-volatile memory element layer) after formation of the uppermost non-volatile memory element layer (in Experiment 4, second non-volatile memory element layer) is completed can have an equal initial resistance.

By conducting a similar experiment, the thickness in formation could be made different, among the steps of forming the non-volatile memory element layers so that all of the non-volatile memory elements after formation of the uppermost non-volatile memory element layer can have an equal initial resistance, depending on specific embodiments.

Embodiment 2

In Embodiment 1, the element characteristics are made uniform using the thicknesses of the second metal oxide layers. Embodiment 2 is different from Embodiment 1 in that a third metal oxide layer is formed on an outer peripheral portion of each of the first metal oxide layers, and the element area and the width of the third metal oxide layer are adjusted to attain uniform element characteristics.

Figure 9:
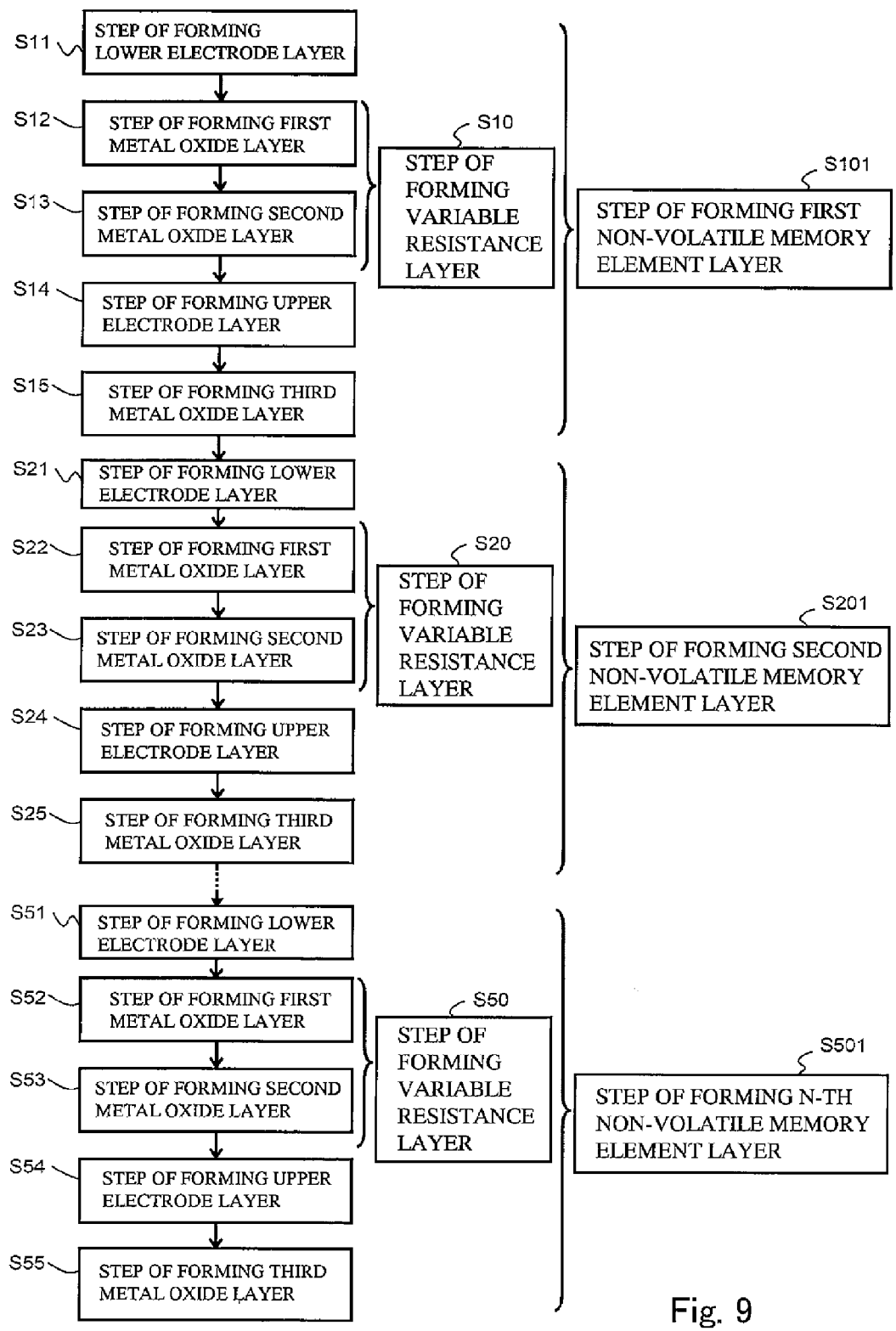
FIG. 9 is a flow chart showing an exemplary manufacturing method of a variable resistance non-volatile memory device according to Embodiment 2.

FIG. 9 is a flow chart showing an exemplary manufacturing method of a variable resistance non-volatile memory device according to Embodiment 2.

As shown in FIG. 9, in a manufacturing method of a variable resistance non-volatile memory device according to Embodiment 2, the step (S101, S201, . . . S501) of forming the non-volatile memory element layer is repeated plural times. In the flowchart of FIG. 9, the step of forming the non-volatile memory element layer is repeated N times. N may be a natural number of 2 or more.

The step of forming the non-volatile memory element layer includes the step (S11, S21, . . . S51) of forming the lower electrode layer, the step (S10, S20, . . . S50) of forming the variable resistance layer on and above the lower electrode layer, the step (S14, S24, . . . S54) of forming the upper electrode layer on and above the variable resistance layer, and the step (S15, S25, . . . S55) of forming the third metal oxide layer comprising a third metal oxide having a higher oxygen content atomic percentage than the first metal oxide, on the outer peripheral portion of the first metal oxide layer such that the second metal oxide layer is interposed between the first metal oxide layer and the third metal oxide layer, and the electrode.

The kind of the third metal oxide is not particularly limited. Specifically, for example, as the third metal oxide, at least one metal oxide which is selected from the group consisting of tantalum oxide, hafnium oxide, and zirconium oxide, is suitably used.

In the case where tantalum oxides are used as the first metal oxide, the second metal oxide, and the third metal oxide, $0.8 \leq x \leq 1.9$, $x < y$ and $x < z$ are preferably satisfied, when the first metal oxide is expressed as $TaO_x$ (x: number of atoms of O when number of atoms of Ta is 1), the second metal oxide is expressed as $TaO_y$ (y: number of atoms of O when number of atoms of Ta is 1), and the third metal oxide is expressed as $TaO_z$ (z: number of atoms of O when number of atoms of Ta is 1).

In the case where hafnium oxides are used as the first metal oxide, the second metal oxide, and the third metal oxide, $0.9 \leq x \leq 1.6$, $x < y$ and $x < z$ are preferably satisfied, when the first metal oxide is expressed as $HfO_x$ (x: number of atoms of O when number of atoms of Hf is 1), the second metal oxide is expressed as $HfO_y$ (y: number of atoms of O when number of atoms of Hf is 1), and the third metal oxide is expressed as $HfO_z$ (z: number of atoms of O when number of atoms of Hf is 1).

In the case where zirconium oxides are used as the first metal oxide, the second metal oxide, and the third metal oxide, $0.9 \leq x \leq 1.4$, $x < y$ and $x < z$ are preferably satisfied, when the first metal oxide is expressed as $ZrO_x$ (x: number of atoms of O when number of atoms of Zr is 1), the second metal oxide is expressed as $ZrO_y$ (y: number of atoms of O when number of atoms of Zr is 1), and the third metal oxide is expressed as $ZrO_z$ (z: number of atoms of O when number of atoms of Zr is 1).

A relationship of magnitude between y and z is not particularly limited. y and z are preferably values which allow each of the metal oxides to be an insulating layer. Or, a resistivity of each of the second metal oxide and the third metal oxide is equal to or greater than $10^7$ m Ωm.

The third metal oxide layer is preferably formed to surround an entire peripheral portion of the first metal oxide layer. Preferably, the first metal oxide layer and the third metal oxide layer have upper end surfaces which are coplanar with each other and lower end surfaces which are coplanar with each other, and the second metal oxide layer is disposed to cover the entire of one of the upper and lower end surfaces. A contour of the second metal oxide layer and a contour of the third metal oxide layer preferably conform to each other when viewed from a direction in which the second metal oxide layer and the third metal oxide layer are stacked together.

In the case where the variable resistance layer is formed in, for example, a band shape, the third metal oxide layer may be formed at right and left sides of the first metal oxide layer when a lengthwise direction of the first metal oxide layer is a forward and rearward direction.

The step of forming the lower electrode layer, the step of forming the variable resistance layer and the step of forming the upper electrode layer may be the same as those of Embodiment 1 and will not be described in repetition.

Hereinafter, an area of a portion of the second metal oxide layer and a portion of the first metal oxide layer, which portions are in contact with each other, in each of the non-volatile memory element layers, just after the step of forming the corresponding non-volatile memory element layer is completed, will be referred to as "area in formation".

In the present embodiment, the area in formation is made different among the steps of forming the non-volatile memory element layers so that all of the non-volatile memory elements after formation of the uppermost non-volatile memory element layer is completed can have an equal initial resistance value.

The step of forming the third metal oxide layer may be performed in such a manner that, for example, the variable resistance layer and the upper electrode layer are patterned, and then are thermally treated (annealed) in an oxygen atmosphere. A heating temperature may be, for example, 300 degrees C. to 450 degrees C. In such a method, the outer peripheral portion which is a portion of the first metal oxide layer is oxidized, to form the third metal oxide layer.

In a case where the third metal oxide layer is formed by such a method, the temperature of the heating process may be raised or lowered, or a time of the heating process may be increased or decreased, thereby allowing the area in formation to be made different among the steps of forming the non-volatile memory element layers.

For a period of time that passes from when the variable resistance layer of the non-volatile memory element in the first layer is formed before the variable resistance layer of the non-volatile memory element in the second layer is formed, additional heat is applied to the variable resistance layer of the non-volatile memory element in the first layer. This heating causes oxygen to diffuse from the third metal oxide layer 105c with a higher oxygen content atomic percentage to the first metal oxide layer 105a with a lower oxygen content atomic percentage, and oxygen to be supplied from the second interlayer insulating layer 107 to the third metal oxide layer 105c. Because of the diffusion and supply of oxygen, a ratio of the area of the first metal oxide layer 105a with respect to the area of the entire element decreases, and thus, an effective area of the non-volatile memory element in the first layer substantially decreases.

To attain a substantially equal effective area among the plurality of non-volatile memory element layers, for example, the width of the third metal oxide layer 105c of the non-volatile memory element in the first layer, in formation of the first layer, may be adjusted to be smaller than the width of the third metal oxide layer 205c of the non-volatile memory element in the second layer, in formation of the second layer (Example 1).

Alternatively, for example, the area of the non-volatile memory element in the first layer in formation of the first layer may be adjusted to be greater than the area of the non-volatile memory element in the second layer in formation of the second layer (Example 2).

In a case where non-volatile memory elements each including a variable resistance layer including a plurality of metal oxide layers which are different from each other in oxygen content atomic percentage and are stacked together, are stacked together, heat budget (accumulated heating amount) is different among the non-volatile memory element layers, which may result in fluctuation of the oxygen profiles and hence fluctuation of the element characteristics. In the variable resistance non-volatile memory device and the manufacturing method thereof of the present embodiment, by adjusting at least one of the thickness of the third metal oxide layer (layer with a higher oxygen content atomic percentage: higher-resistance layer) and the element area, which would directly affect the effective area, the characteristics of the cells in a completed state of the device can be made uniform. Therefore, it becomes possible to provide a variable resistance non-volatile memory device which is uniform in the resistance changing characteristics. As a result, the memory having more layers and a greater capacity can be implemented easily.

Alternatively, by adjusting both of the thickness of the third metal oxide layer and the element area, the characteristics of the cells in the completed state can be made uniform.

In the case where at least one of the lower electrode and the upper electrode is exposed to an oxidizing agent, preferably, the electrode may comprise a material which is oxidized less easily to allow the entire one main surface of the first metal oxide remaining after forming the third metal oxide layer to contribute to the resistance changing operation. For example, precious metal is oxidized less easily and is suitably used as an electrode material. Or, tantalum nitride is suitably used as the electrode material, because an oxidation amount of tantalum nitride is much less than that of the third metal oxide layer (not shown) in the heating process as described above.

Because of the above step, a region (area of a portion of the first metal oxide layer and a portion of the electrode which face each other: effective area) which is electrically active in the non-volatile memory element is reduced, and a current density increases. Therefore, a break voltage can be lowered, and break processing can be performed in a short time.

Alternatively, the step of forming the third metal oxide layer may be carried out by oxidizing the outer peripheral portion which is a portion of the first metal oxide layer by another method.

Modified example of Embodiment 1 may be applicable in the same manner in Embodiment 2.

Example 1

In Example 1 of Embodiment 2, the area of the portion of the third metal oxide layer and the portion of the second metal oxide layer, which portions are in contact with each other just after the step of forming the corresponding non-volatile memory element layer is completed is made smaller in the step corresponding to the lower non-volatile memory element layer, among the steps of forming the non-volatile memory element layers.

In this configuration, the area of the portion of the third metal oxide layer and the portion of the second metal oxide layer, which portions are in contact with each other is made greater in the lower non-volatile memory element layer, due to the step including the heating performed after the corresponding non-volatile memory element layer is formed. This allows the areas each of which is defined by the portion of the third metal oxide layer and the portion of the second metal oxide layer, which portions are in contact with each other at a time point when formation of the uppermost non-volatile memory element layer is completed, to be substantially made equal. As a result, the areas each of which is defined by the portion of the first metal oxide layer and the portion of the second metal oxide layer, which portions are in contact with each other, can be made substantially equal.

FIGS. 10A to 10E are views showing the steps of a manufacturing method of the variable resistance non-volatile memory device according to Example 1 of Embodiment 2. Hereinafter, the manufacturing method of the present example will be described with reference to FIGS. 10A to 10E.

Figure 10A:
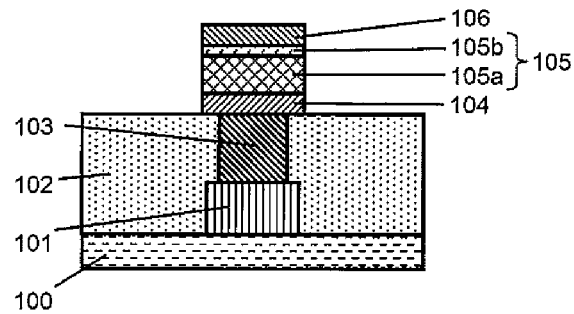
FIG. 10A is a view showing the step of forming on and above the substrate, the first wire, the first interlayer insulating layer, the first contact plug, the patterned lower electrode layer, the patterned first metal oxide layer, the patterned second metal oxide layer and the patterned upper electrode layer, in Example 1 of Embodiment 2.

FIG. 10A is a view showing the step of forming on and above the substrate, the first wire, the first interlayer insulating layer, the first contact plug, the patterned lower electrode layer, the patterned first metal oxide layer, the patterned second metal oxide layer and the patterned upper electrode layer, in Example 1 of Embodiment 2. This step may be identical to the steps of FIGS. 7A to 7E, and will not be described in detail in repetition.

These layers may be patterned together using the same mask or individually for each layer.

Figure 10B:
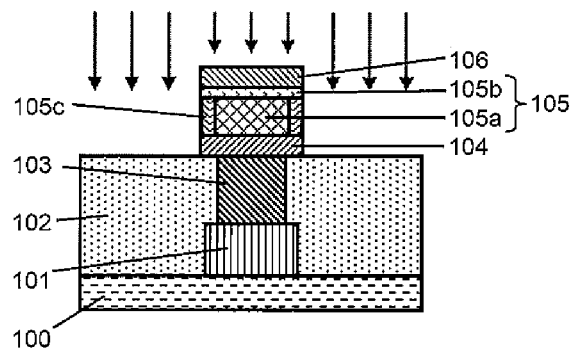
FIG. 10B is a view showing the step of forming the non-volatile memory element in the first non-volatile memory element layer, by oxidizing a portion of the first metal oxide layer to form a third metal oxide layer, in Example 1 of Embodiment 2.

FIG. 10B is a view showing the step of forming the non-volatile memory element in the first non-volatile memory element layer, by oxidizing a portion of the first metal oxide layer to form the third metal oxide layer, in Example 1 of Embodiment 2. Specifically, the step may be carried out by the heating process (annealing) in oxygen atmosphere of, for example, 300 degrees C. to 450 degrees C. In this step, a portion of the first metal oxide layer 105a is oxidized to form the third metal oxide layer 105c. When the second metal oxide layer 105b comprises $Ta_2O_5$, the second metal oxide layer 105b is not oxidized substantially.

Figure 10C:
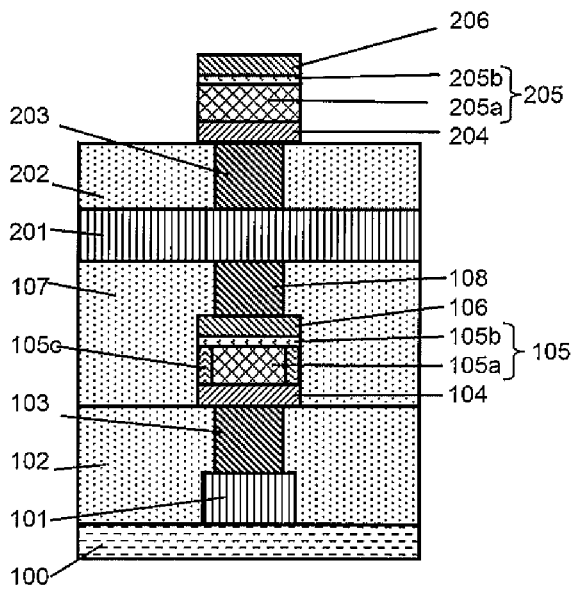
FIG. 10C is a view showing the step of forming, on and above the non-volatile memory element, the second interlayer insulating layer, the second contact plug, the second wire, the third interlayer insulating layer, the third contact plug, the patterned lower electrode layer, the patterned first metal oxide layer, the patterned second metal oxide layer, and the patterned upper electrode layer, in Example 1 of Embodiment 2.
Figure 10D:
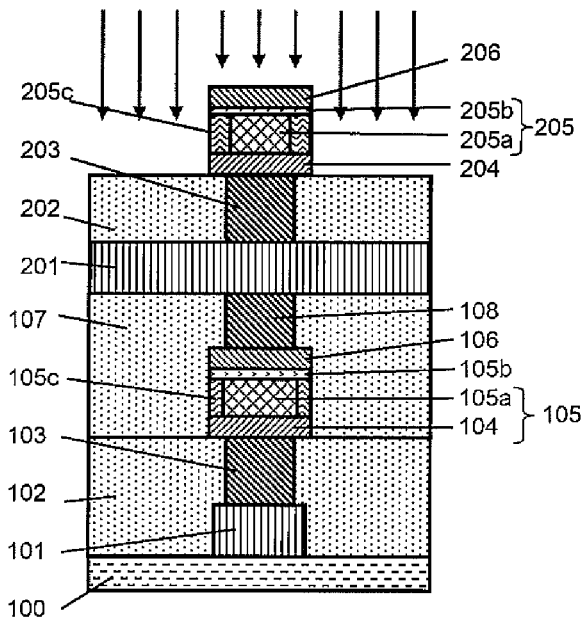
FIG. 10D is a view showing the step of forming the non-volatile memory element in the second non-volatile memory element layer, by oxidizing a portion of the first metal oxide layer to form the third metal oxide layer, in Example 1 of Embodiment 2.

In this step, conditions of the oxidation step are set so that an oxidation amount of the first metal oxide layer is made less than that in the step of FIG. 10D. The oxidation amount of the first metal oxide layer may be adjusted by, for example, increasing/decreasing at least one of a heating temperature and a heating time. The extent up to which the oxidation amount of the first metal oxide layer should be increased may be decided suitably by conducting an experiment similar to Experiment 4 (experiment conditions other than the oxidation step are common to the samples), for the elements including the third metal oxide layers.

FIG. 10C is a view showing the step of forming, on and above the non-volatile memory element, the second interlayer insulating layer, the second contact plug, the second wire, the third interlayer insulating layer, the third contact plug, the patterned lower electrode layer, the patterned first metal oxide layer, the patterned second metal oxide layer and the patterned upper electrode layer, in Example 1 of Embodiment 2. This step may be performed like the steps of FIGS. 7E to 7K, and therefore will not be described in detail in repetition. In the present example, the mask used in the step of FIG. 10C is preferably identical to that used in the step of FIG. 10A.

FIG. 10D is a view showing the step of forming the non-volatile memory element in the second non-volatile memory element layer, by oxidizing a portion of the first metal oxide layer to form the third metal oxide layer, in Example 1 of Embodiment 2.

In this step, conditions of the oxidation step are set so that an oxidation amount of the first metal oxide layer is made greater than that in the step of FIG. 10B. The oxidation amount of the first metal oxide layer may be adjusted by, for example, increasing/decreasing at least one of the heating temperature and the heating time. The extent up to which the oxidation amount of the first metal oxide layer should be increased may be decided suitably by conducting an experiment (experiment conditions other than the oxidation step are common to the samples) similar to Experiment 4, for the elements including the third metal oxide layers.

This step may be identical to the step of FIG. 10B except for the above, and therefore will not be described in detail in repetition.

Figure 10E:
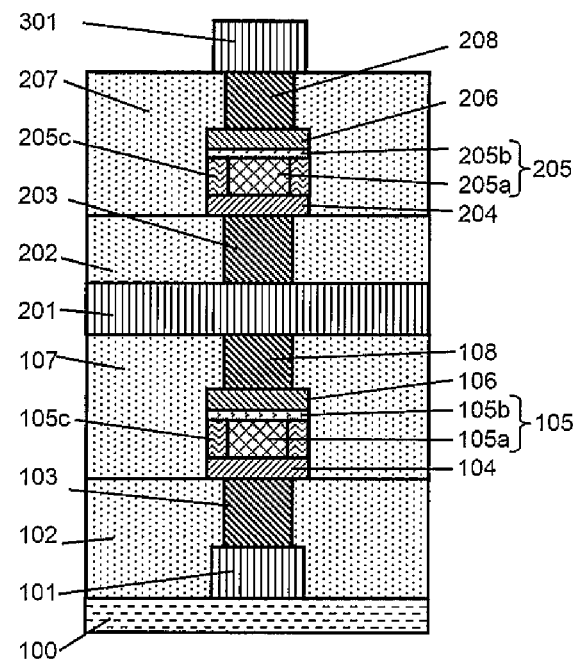
FIG. 10E is a view showing the step of forming, on and above the non-volatile memory element, the fourth interlayer insulating layer, the forth contact plug, and the third wire, in Example 1 of Embodiment 2.

FIG. 10E is a view showing the step of forming, on and above the non-volatile memory element, the fourth interlayer insulating layer, the forth contact plug, and the third wire, in Example 1 of Embodiment 2. This step may be identical to the step of FIG. 7L, and therefore will not be described in detail in repetition.

Through the above method, it is possible to manufacture a cross-point variable resistance memory device including two non-volatile memory element layers can be manufactured.

The steps of FIGS. 10B and 10D correspond to the step of forming the third metal oxide layer (S15, S25 in FIG. 9). An area of a portion of the second metal oxide layer 105b and a portion of the first metal oxide layer 105a, which portions are in contact with each other in the first non-volatile memory element layer at a time point when the step of FIG. 10B is completed, may be an area in formation in the first non-volatile memory element layer. An area of a portion of the second metal oxide layer 205b and a portion of the first metal oxide layer 205a, which portions are in contact with each other in the second non-volatile memory element layer at a time point when the step of FIG. 1 OD is completed may be area in formation in the second non-volatile memory element layer.

A variable resistance memory device including a third non-volatile memory element layer may be manufactured by performing again the step of forming the interlayer insulating layer, the contact plug, the patterned lower electrode layer, the patterned first metal oxide layer, the patterned second metal oxide layer, and the patterned upper electrode layer, of the step of FIG. 10A, the step of FIG. 10B, and the step of forming the interlayer insulating layer and the wire, of the step of FIG. 10C, after the step of FIG. 10E. In addition, a variable resistance memory device including a fourth non-volatile memory element layer may be manufactured by performing again the step of forming the interlayer insulating layer, the contact plug, the patterned lower electrode layer, the patterned first metal oxide layer, the patterned second metal oxide layer, and the patterned upper electrode layer, of the step of FIG. 10C, and the steps of FIGS. 10D and 10E. After that, in the same method, a variable resistance memory device including five or more non-volatile memory element layers can be manufactured.

Example 2

In Example 2 of Embodiment 2, the area of the upper electrode layer just after the step of forming each of the non-volatile memory element layers is completed is made greater in the step corresponding to a lower non-volatile memory element layer, among the steps of forming the non-volatile memory element layers. In the present example, the area of the upper electrode layer is equal to a physical area of the non-volatile memory element.

In this configuration, the area of the portion of the third metal oxide layer and the portion of the second metal oxide layer, which portions are in contact with each other, is made greater, in the lower non-volatile memory element layer, due to the step including the heating process performed after forming the corresponding non-volatile memory element layer. Therefore, the areas (effective areas) each of which is defined by the portion of the first metal oxide layer and the portion of the second metal oxide layer, which portions are in contact with each other at a time point when formation of the uppermost non-volatile memory element layer is completed can be made equal.

FIGS. 11A to 11E are views showing the manufacturing method of the variable resistance non-volatile memory device according to Example 2 of Embodiment 2. Hereinafter, the manufacturing method of the present example will be described with reference to FIGS. 11A to 11E.

Figure 11A:
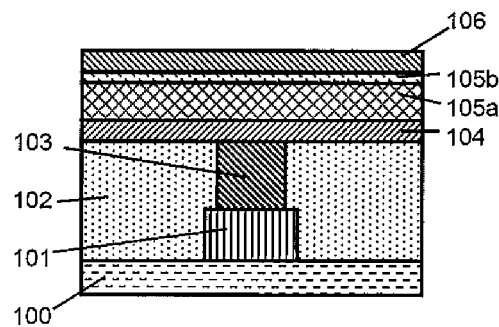
FIG. 11A is a view showing the step of forming on and above the substrate, the first wire, the first interlayer insulating layer, the first contact plug, the lower electrode layer in the first non-volatile memory element layer, the first metal oxide layer in the first non-volatile memory element layer, the second metal oxide layer in the first non-volatile memory element layer, and the upper electrode layer in the first non-volatile memory element layer, in Example 2 of Embodiment 2.

FIG. 11A is a view showing the step of forming on and above the substrate, the first wire, the first interlayer insulating layer, the first contact plug, the lower electrode layer in the first non-volatile memory element layer, the first metal oxide layer in the first non-volatile memory element layer, the second metal oxide layer in the first non-volatile memory element layer, and the upper electrode layer in the first non-volatile memory element layer, in Example 2 of Embodiment 2. This step may be identical to the steps of FIGS. 7A to 7D, and will not be described in detail in repetition.

Figure 11B:
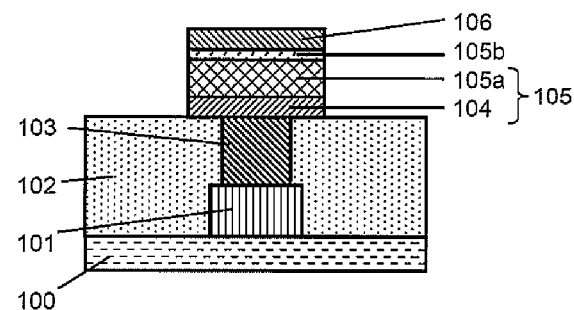
FIG. 11B is a view showing the step of patterning the lower electrode layer, the first metal oxide layer, the second metal oxide layer and the upper electrode layer, in Example 2 of Embodiment 2.

FIG. 11B is a view showing the step of patterning the lower electrode layer, the first metal oxide layer, the second metal oxide layer and the upper electrode layer, in Example 2 of Embodiment 2.

In this step, the area (area of upper end surface) of a stack comprising the lower electrode layer, the first metal oxide layer, the second metal oxide layer, and the upper electrode layer which are formed by patterning may be not less than 200 nm and not more than 700 nm. This area is set greater than the area of the non-volatile memory element in the second layer (upper layer). This is because, an accumulated heating amount (heat budget) corresponding to a cell in a lower layer is greater than that corresponding to a cell in an upper layer, and therefore, the effective area in the cell in the lower layer is reduced to a greater degree. This step may be identical to the step of FIG. 7E except for the above, and will not be described in detail in repetition.

The layers may be patterned together using the same mask or individually for each layer.

Figure 11C:
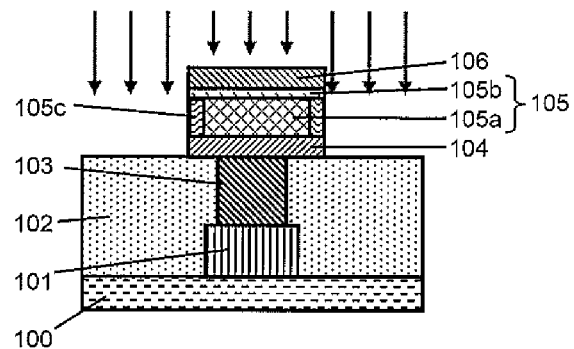
FIG. 11C is a view showing the step of forming the non-volatile memory element in the first non-volatile memory element layer, by oxidizing a portion of the first metal oxide layer to form the third metal oxide layer, in Example 2 of Embodiment 2.

FIG. 11C is a view showing the step of forming the non-volatile memory element in the first non-volatile memory element layer, by oxidizing a portion of the first metal oxide layer to form the third metal oxide layer, in Example 2 of Embodiment 2.

Figure 11D:
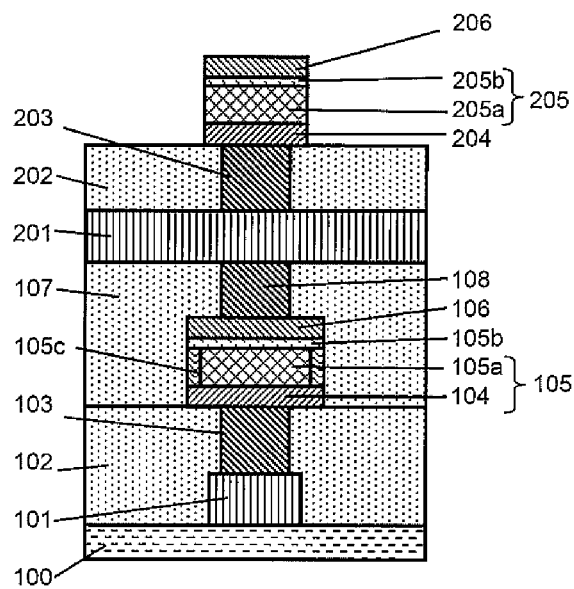
FIG. 11D is a view showing the step of forming, on and above the non-volatile memory element, the second interlayer insulating layer, the second contact plug, the second wire, the third interlayer insulating layer, the third contact plug, the patterned lower electrode layer, the patterned first metal oxide layer, the patterned second metal oxide layer and the patterned upper electrode layer, in Example 2 of Embodiment 2.

FIG. 11D is a view showing the step of forming, on and above the non-volatile memory element, the second interlayer insulating layer, the second contact plug, the second wire, the third interlayer insulating layer, the third contact plug, the patterned lower electrode layer, the patterned first metal oxide layer, the patterned second metal oxide layer and the patterned upper electrode layer, in Example 2 of Embodiment 2.

In this step, the shapes of the masks are suitably set so that the area of the upper electrode layer in the second non-volatile memory element layer is smaller than the area of the upper electrode layer in the first non-volatile memory element layer. Specifically, for example, the area (area of upper end surface) of a stack comprising the lower electrode layer, the first metal oxide layer, the second metal oxide layer and the upper electrode layer which are formed by patterning may be not less than 100 nm and not more than 500 nm. The extent to which the size of the mask is reduced may be suitably decided by conducting an experiment (experiment conditions other than the shapes of the masks are common to the samples) similar to Experiment 4, for the elements including the third metal oxide layers. This step may be identical to the steps of FIGS. 7F to 7K except for the above, and will not be described in detail in repetition.

Figure 11E:
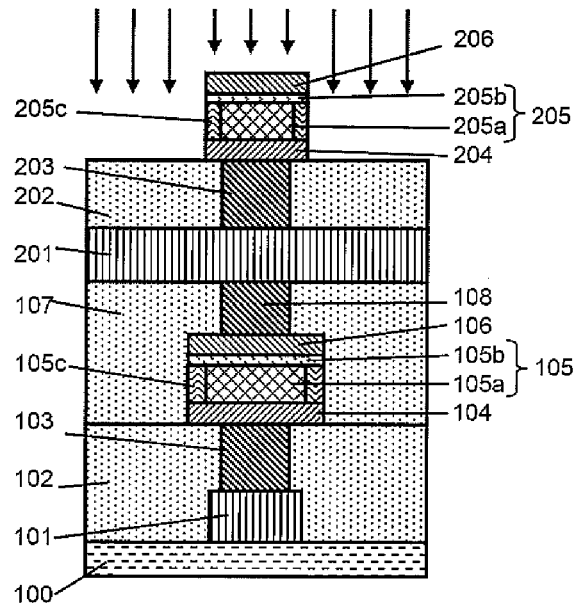
FIG. 11E is a view showing the step of forming the non-volatile memory element in the second non-volatile memory element layer, by oxidizing a portion of the first metal oxide layer to form the third metal oxide layer, in Example 2 of Embodiment 2.

FIG. 11E is a view showing the step of forming the non-volatile memory element in the second non-volatile memory element layer, by oxidizing a portion of the first metal oxide layer to form a third metal oxide layer, in Example 2 of Embodiment 2. This step may be identical to the step of FIG. 10B, and will not be described in detail in repetition. In the present example, conditions of the oxidation step of FIG. 11E are preferably identical to conditions of the oxidation step of FIG. 11C.

Figure 11F:
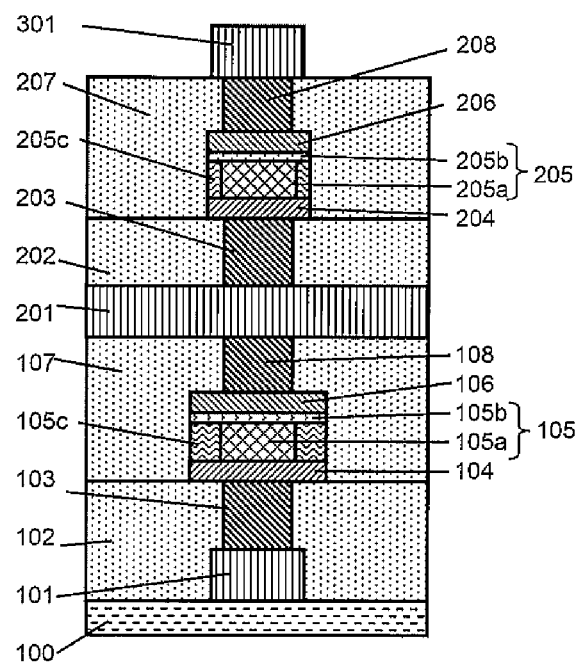
FIG. 11F is a view showing the step of forming on and above the non-volatile memory element, the fourth interlayer insulating layer, the fourth contact plug, and the third wire, in Example 2 of Embodiment 2.

FIG. 11F is a view showing the step of forming on and above the non-volatile memory element, a fourth interlayer insulating layer, a fourth contact plug, and a third wire, in Example 2 of Embodiment 2. This step may be identical to the step of FIG. 7L, and will not be described in detail in repetition.

Through the above method, a cross-point variable resistance memory device including two non-volatile memory element layers is manufactured.

The steps of FIGS. 11C and 11E correspond to the step (S15, S25 in FIG. 9) of forming the third metal oxide layer. An area of a portion of the second metal oxide layer 105b and a portion of the first metal oxide layer 105a, which portions are in contact with each other in the first non-volatile memory element layer at a time point when the step of FIG. 11C is completed, may be an area in formation in the first non-volatile memory element layer. An area of a portion of the second metal oxide layer 205b and a portion of the first metal oxide layer 205a, which portions are in contact with each other in the second non-volatile memory element layer at a time point when the step of FIG. 11E is completed may be an area in formation in the second non-volatile memory element layer.

A variable resistance memory device including a third non-volatile memory element layer may be manufactured by performing again the step of forming the interlayer insulating layer, the contact plug, the lower electrode layer, the first metal oxide layer, the second metal oxide layer, and the upper electrode layer, of the step of FIG. 10A, the steps of FIGS. 10B and 10C, and the step of forming the interlayer insulating layer and the wire, of the step of FIG. 10D, after the step of FIG. 11F. In addition, a variable resistance memory device including a fourth non-volatile memory element layer may be manufactured by performing again the step of forming the interlayer insulating layer, the contact plug, the patterned lower electrode layer, the patterned first metal oxide layer, the patterned second metal oxide layer, and the patterned upper electrode layer, of the step of FIG. 10D, and the steps of FIGS. 10E and 10F. After that, in the same method, a variable resistance memory device including five or more non-volatile memory element layers can be manufactured.

Embodiment 3

In Embodiment 2, the element characteristics can be made uniform by adjusting the element area and the width of the third metal oxide layer. Embodiment 3 is different from Embodiment 2 in that supply of oxygen from interlayer insulating layer to the third metal oxide layer can be suppressed by providing an oxygen barrier layer.

Figure 12:
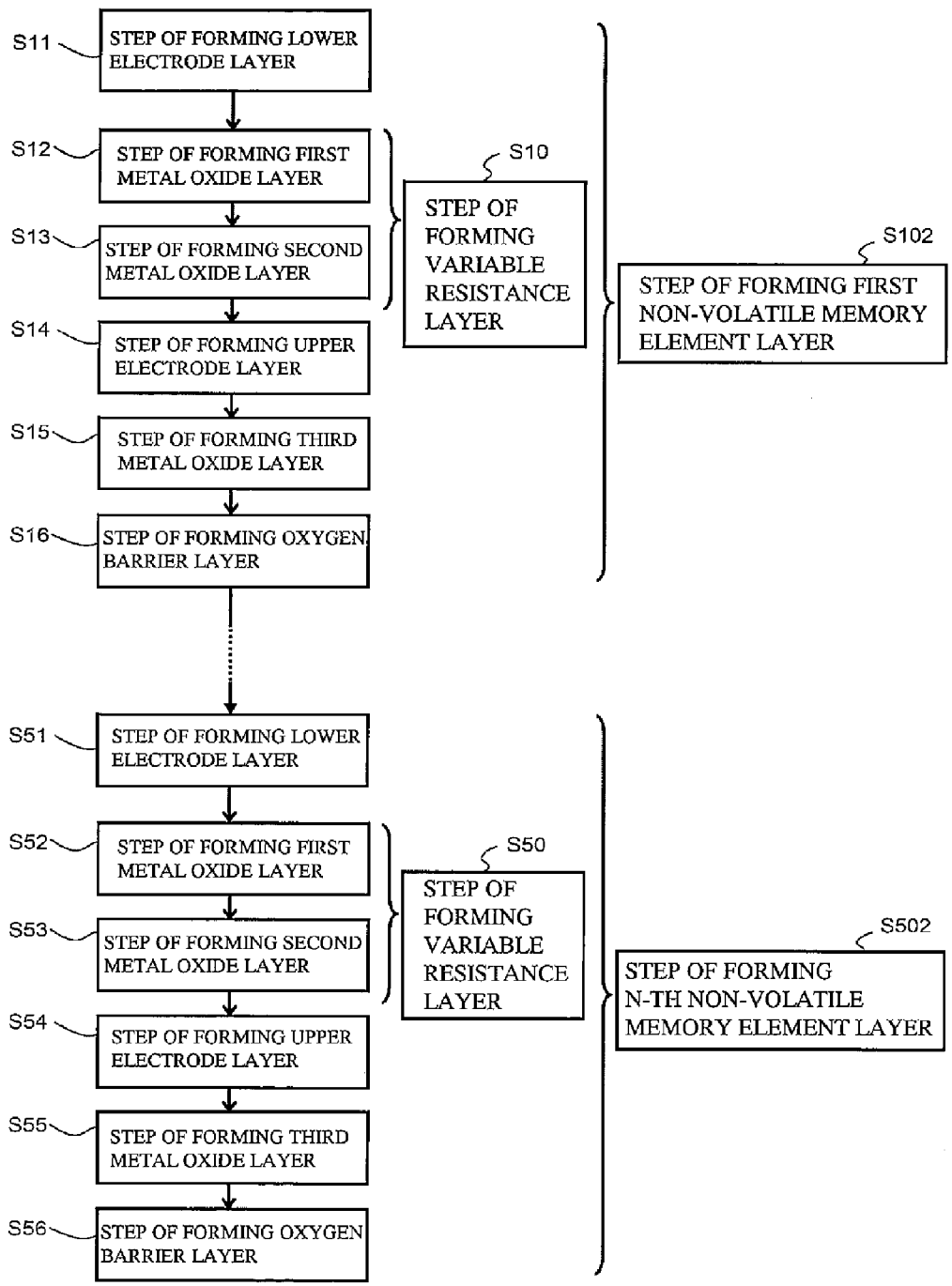
FIG. 12 is a flow chart showing an exemplary manufacturing method of a variable resistance non-volatile memory device according to Embodiment 3.

FIG. 12 is a flowchart showing an example of Embodiment 3.

As shown in FIG. 12, in a manufacturing method of a variable resistance non-volatile memory device according to Embodiment 3, the step (S102, S202, ... S502) of forming the non-volatile memory element layer is repeated plural times. In the flowchart of FIG. 12, the step of forming the non-volatile memory element layer is repeated N times. N may be a natural number of 2 or more.

The step of forming the non-volatile memory element layer includes the step (S11, ... S51) of forming the lower electrode layer, the step (S10, ... S50) of forming the variable resistance layer on and above the lower electrode layer, the step (S14, ... S54) of forming the upper electrode layer on and above the variable resistance layer, the step (S15, ... S55) of forming the third metal oxide layer comprising a third metal oxide having a higher oxygen content atomic percentage than the first metal oxide on the outer peripheral portion of the first metal oxide layer such that the second metal oxide layer is interposed between the first metal oxide layer and the third metal oxide layer, and the electrode, and the step (S16, ... S56) of forming the oxygen barrier layer on the side wall of the variable resistance layer.

The oxygen barrier layer may comprise, for example, silicon nitride ($Si_3N_4$). The oxygen barrier layer can be formed in such a manner that a silicon nitride is deposited by, for example, plasma CVD, sputtering, etc., and an unnecessary portion of silicon nitride is removed by etch back.

The oxygen barrier layer may cover only a portion of the side wall of the variable resistance layer. Preferably, the oxygen barrier layer covers the entire side wall of the variable resistance layer.

The oxygen barrier layer is able to suppress the oxidizing agent (oxygen, etc.) from migrating from outside to the variable resistance layer, especially to the first metal oxide layer and the third metal oxide layer, and suppress an effect on the effective area which would be caused by the step accompanied by heating. Specifically, for example, a reduction of the first metal oxide layer can be suppressed, or, for example, an increase in the third metal oxide layer can be suppressed.

The step of forming the lower electrode layer, the step of forming the variable resistance layer, and the step of forming the upper electrode layer may be the same as those of Embodiment 1, and will not be described in detail in repetition.

The step of forming the third metal oxide layer may be identical to that of Embodiment 2 and will not be described in detail in repetition.

For a period of time from when the variable resistance layer of the non-volatile memory element in the first layer is formed before the variable resistance layer of the non-volatile memory element in the second layer is formed, unnecessary heat is applied to the variable resistance layer of the non-volatile memory element in the first layer. This heating causes oxygen to diffuse from the third metal oxide layer 105c with a higher oxygen content atomic percentage to the first metal oxide layer 105a with a lower oxygen content atomic percentage, and oxygen to be supplied from the second interlayer insulating layer 107 to the third metal oxide layer 105c. By diffusion and supply of oxygen, a ratio of the area of the first metal oxide layer 105a with respect to the area of the entire element decreases, and thus, an effective area of the non-volatile memory element in the first layer substantially decreases.

In the present embodiment, the oxygen barrier layer is able to suppress oxygen from migrating from the second interlayer insulating layer 107 to the third metal oxide layer 105c. This makes it possible to suppress a reduction of the effective area of the non-volatile memory element in the first layer. To attain a substantially equal effective area, for example, it is sufficient that the width of the third metal oxide layer 205c of the non-volatile memory element in the second layer is slightly greater, or the width of the third metal oxide layer 105c of the non-volatile memory element in the first layer is made slightly smaller. In a case where at least one of Embodiment 1 and Embodiment 2 is combined with Embodiment 3, the thickness in formation and the area in formation can be easily adjusted. In the case where fluctuation of the effective area is suppressed almost perfectly by providing the oxygen barrier layer, it is not necessary to adjust the area in formation.

In a case where non-volatile memory elements each including a variable resistance layer including a plurality of metal oxide layers which are different from each other in oxygen content atomic percentage and are stacked together, are stacked together, heat budget (accumulated heating amount) is different among the non-volatile memory element layers, which may result in fluctuation of the oxygen profiles and hence fluctuation of the element characteristics. In the variable resistance non-volatile memory device and the manufacturing method thereof of the present embodiment, the oxygen barrier layer is able to suppress migration of oxygen from the interlayer insulating layer and an increase in the area of the third metal oxide layer, which would directly affect the effective area, thereby attaining a state in which the characteristics of the cells in a completed state of the device can be made uniform. Therefore, it becomes possible to provide a variable resistance non-volatile memory device which is uniform in the resistance changing characteristics. As a result, the memory having more layers and a greater capacity can be implemented easily.

Example 1

FIGS. 13A to 13F are views showing a manufacturing method of the variable resistance non-volatile memory device according to Example 1 of Embodiment 3. Hereinafter, the manufacturing method of the present example will be described with reference to FIGS. 13A to 11F.

Figure 13A:
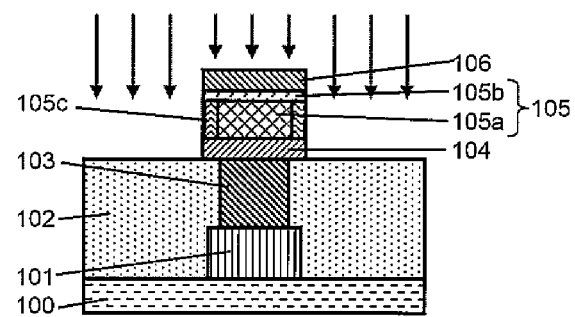
FIG. 13A is a view showing the step of forming the non-volatile memory element in the first non-volatile memory element layer in such a manner that the first wire, the first interlayer insulating layer and the first contact plug are formed on and above the substrate, the lower electrode layer, the first metal oxide layer, the second metal oxide layer and the upper electrode layer are formed by patterning on and above the first wire, the first interlayer insulating layer and the first contact plug, and a portion of the first metal oxide layer is oxidized to form the third metal oxide layer.

FIG. 13A is a view showing the step of forming the non-volatile memory element in the first non-volatile memory element layer in Example 1 of Embodiment 3, in such a manner that the first wire, the first interlayer insulating layer and the first contact plug are formed on and above the substrate, the lower electrode layer, the first metal oxide layer, the second metal oxide layer and the upper electrode layer are formed by patterning on and above the first wire, the first interlayer insulating layer and the first contact plug, and a portion of the first metal oxide layer is oxidized to form the third metal oxide layer. This step may be identical to the steps of FIGS. 10A and 10B and will not be described in detail in repetition.

Figure 13B:
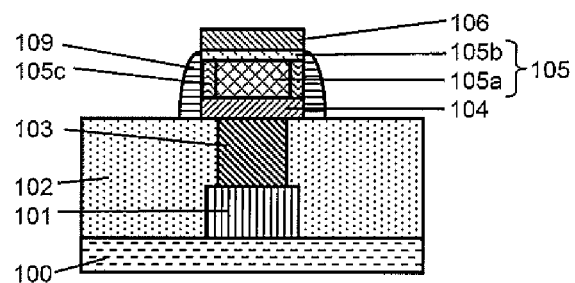
FIG. 13B is a view showing the step of forming an oxygen barrier layer on a side wall of a variable resistance layer in the first non-volatile memory element layer, in Example 1 of Embodiment 3.

FIG. 13B is a view showing the step of forming the oxygen barrier layer on the side wall in the variable resistance layer in the first non-volatile memory element layer, in Example 1 of Embodiment 3. The oxygen barrier layer 109 is formed by for example, the method described below. Initially, on and above the first interlayer insulating layer 102 provided with the non-volatile memory element, silicon nitride ($Si_3N_4$) which is an oxygen barrier material is deposited with a thickness of 20 nm by plasma CVD. Then, an unnecessary portion of silicon nitride is removed by etch back (example of etching gas: fluorine based gas such as $CHF_3$). Through this process, the oxygen barrier layer 109 is formed. At this time, conditions of the removing step are preferably adjusted so that at least the third metal oxide layer 105c is entirely covered with silicon nitride.

The oxygen barrier layer 109 is able to suppress oxygen from migrating from the second interlayer insulating layer 107 to the third metal oxide layer 105c or oxygen migrating from outside of the second interlayer insulating layer 107 to the third metal oxide layer 105c.

By using the plasma CVD as the deposition method of the oxygen barrier material, a portion defined by the non-volatile memory element and the first interlayer insulating layer 102 can be fully filled with the oxygen barrier material (good step coverage property is attained).

By using the sputtering as the deposition method of the oxygen barrier material, a lowered temperature can be easily attained, and a change in the oxygen profile (vertical distribution) of the variable resistance layer can be suppressed.

Figure 13C:
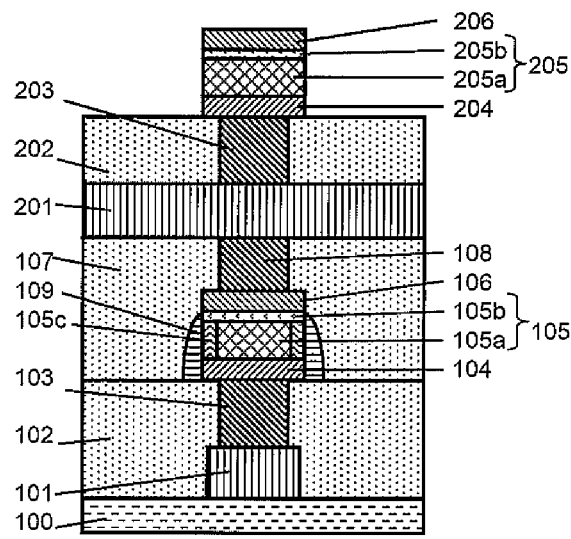
FIG. 13C is a view showing the step of forming, on and above the non-volatile memory element with the side wall of the variable resistance layer covered with the oxygen barrier layer, the second interlayer insulating layer, the second contact plug, the second wire, the third interlayer insulating layer, the third contact plug, the patterned lower electrode layer, the patterned first metal oxide layer, the patterned second metal oxide layer and the patterned upper electrode layer in Example 1 of Embodiment 3.

FIG. 13C is a view showing the step of forming, on and above the non-volatile memory element with the side wall of the variable resistance layer covered with the oxygen barrier layer, the second interlayer insulating layer, the second contact plug, the second wire, the third interlayer insulating layer, the third contact plug, the patterned lower electrode layer, the patterned first metal oxide layer, the patterned second metal oxide layer and the patterned upper electrode layer, in Example 1 of Embodiment 3. This step may be identical to the steps of FIGS. 7F to 7K, and will not be described in detail in repetition.

Figure 13D:
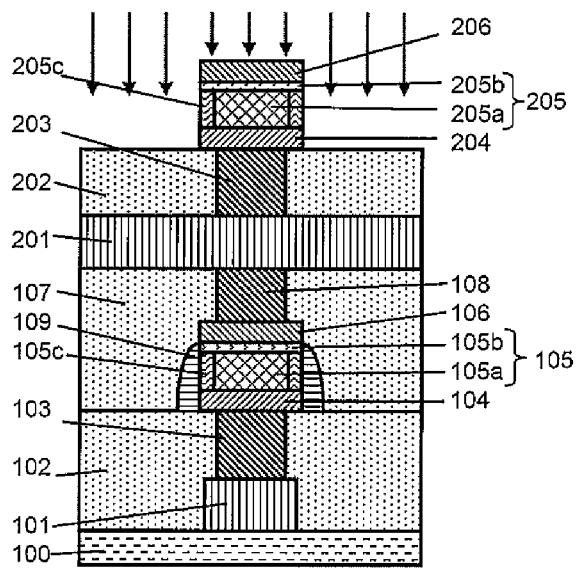
FIG. 13D is a view showing the step of forming the non-volatile memory element in the second non-volatile memory element layer, by oxidizing a portion of the first metal oxide layer to form the third metal oxide layer, in Example 1 of Embodiment 3.

FIG. 13D is a view showing the step of forming the non-volatile memory element in the second non-volatile memory element layer, by oxidizing a portion of the first metal oxide layer to form the third metal oxide layer, in Example 1 of Embodiment 3. This step may be identical to the step of FIG. 10B and will not be described in detail in repetition.

Figure 13E:
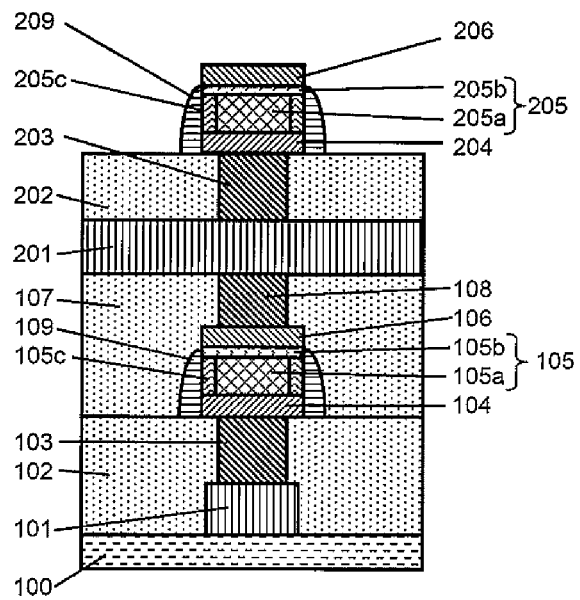
FIG. 13E is a view showing the step of forming the oxygen barrier layer on the side wall of the variable resistance layer in the second non-volatile memory element layer, in Example 1 of Embodiment 3.

FIG. 13E is a view showing the step of forming the oxygen barrier layer on the side wall of the variable resistance layer in the second non-volatile memory element layer, in Example 1 of Embodiment 3. This step may be identical to the step of FIG. 13B, and will not be described in detail in repetition.

Figure 13F:
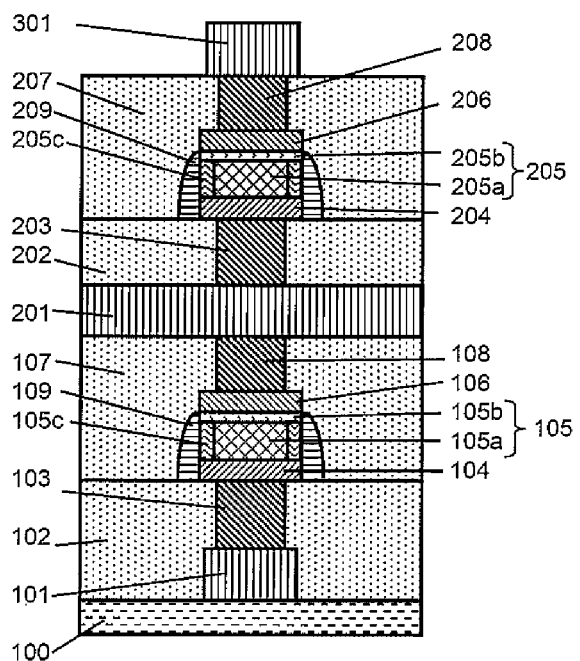
FIG. 13F is a view showing the step of forming, on and above the non-volatile memory element with the side wall of the variable resistance layer covered with the oxygen barrier layer, the fourth interlayer insulating layer, the fourth contact plug, and the third wire, in Example 1 of Embodiment 3.

FIG. 13F is a view showing the step of forming, on and above the non-volatile memory element with the side wall of the variable resistance layer covered with the oxygen barrier layer, the fourth interlayer insulating layer, the fourth contact plug, and the third wire, in Example 1 of Embodiment 3. This step may be identical to the step of FIG. 7L, and will not be described in detail in repetition.

By the above described method, a cross-point variable resistance memory device having two non-volatile memory element layers is manufactured.

The steps of FIGS. 13B and 13E correspond to the step (S16, S56 in FIG. 12) of forming the oxygen barrier layer. A thickness of the second metal oxide layer 105b at a time point when the step of FIG. 13B is completed may be a thickness in formation in the first non-volatile memory element layer. An area of a portion of the second metal oxide layer 105b and a portion of the first metal oxide layer 105a, which portions are in contact with each other in the first non-volatile memory element layer at a time point when the step of FIG. 13B is completed, may be an area in formation in the first non-volatile memory element layer. A thickness of the second metal oxide layer 205b at a time point when the step of FIG. 13E is completed may be a thickness in formation in the second non-volatile memory element layer. An area of a portion of the second metal oxide layer 205b and a portion of the first metal oxide layer 205a, which portions are in contact with each other in the second non-volatile memory element layer at a time point when the step of FIG. 13E is completed may be area in formation in the second non-volatile memory element layer.

A variable resistance memory device including a third non-volatile memory element layer may be manufactured by performing again the step of forming the interlayer insulating layer, the contact plug, and the variable resistance element, of the step of FIG. 13A, the step of FIG. 13B, and the step of forming the interlayer insulating layer and the wire, of the step of FIG. 13C, after the step of FIG. 13F. In addition, a variable resistance memory device including a fourth non-volatile memory element layer may be manufactured by performing again the step of forming the interlayer insulating layer, the contact plug, the patterned lower electrode layer, the patterned first metal oxide layer, the patterned second metal oxide layer, and the patterned upper electrode layer, of the step of FIG. 13C, and the steps of FIGS. 13D to 10F. After that, in the same method, a variable resistance memory device including five or more non-volatile memory element layers can be manufactured.

In the present example, when the oxygen barrier layer is able to almost perfectly suppress the oxidizing agent (oxygen, etc.) from migrating from outside to the variable resistance layer, especially to the first metal oxide layer and the third metal oxide layer, and almost perfectly suppress an effect on the effective area which would be caused by the step accompanied by the heating, the areas in formation in all of the non-volatile memory element layers can be made equal. In this case, by making the thickness in formation different, among the steps of forming the non-volatile memory element layers, all of the non-volatile memory elements in the state in which formation of the uppermost non-volatile memory element layer is completed may be adjusted to have an equal initial resistance.

Experiment 5

In Experiment 5, comparison was made for the width of the third metal oxide layer and the current value, between the element including the oxygen barrier layer and the element including no oxygen barrier layer.

In Experiment 5, the non-volatile memory element was formed in the same method as that for the sample (TEOS) including the interlayer insulating layer comprising TEOS in Experiment 3, except that the oxygen barrier layer was formed before TEOS was deposited by plasma CVD (350 degrees C., hereinafter the same occurs), after forming the non-volatile memory element.

The oxygen barrier layer was formed by the following method. Firstly, silicon nitride ($Si_3N_4$) which was an oxygen barrier material was deposited with a thickness of 20 nm, by plasma CVD. Then, an unnecessary portion of silicon nitride was removed by etch back (etching gas: fluorine based gas such as $CHF_3$).

ΔL was found in the same method as that of Experiment 3. ΔL/2 corresponded to the width of the third metal oxide layer.

Figure 14:
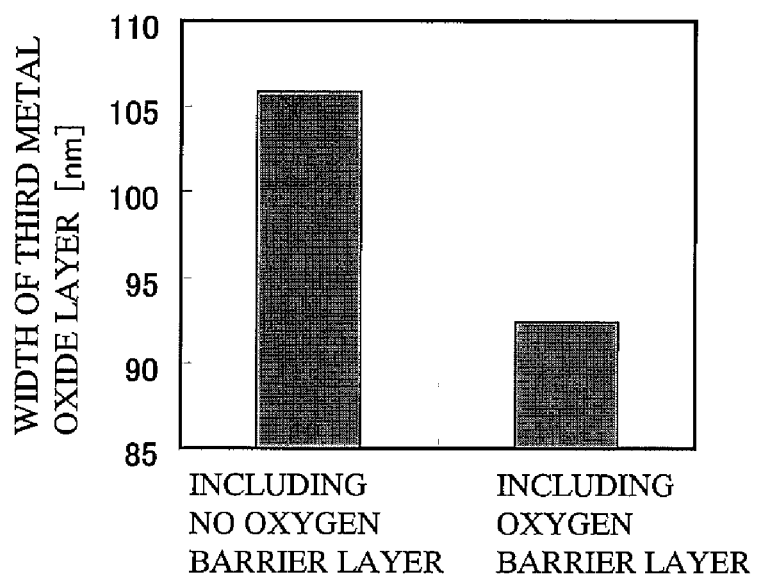
FIG. 14 is a view showing a comparison of width of the third metal oxide layer between the element including the oxygen barrier layer and the element including no oxygen barrier layer, in Experiment 5.

FIG. 14 is a view showing a comparison of the width of the third metal oxide layer between the element including the oxygen barrier layer and the element including no oxygen barrier layer, in Experiment 5. FIG. 14 shows data of the elements created using the mask with a size of (500 nm×500 nm).

As shown in FIG. 14, ΔL/2 of the element including the oxygen barrier layer was 10 nm or more smaller than ΔL/2 of the element including no oxygen barrier layer. From this, it was found that the oxygen barrier layer could suppress oxidation of the third metal oxide layer.

Figure 15:
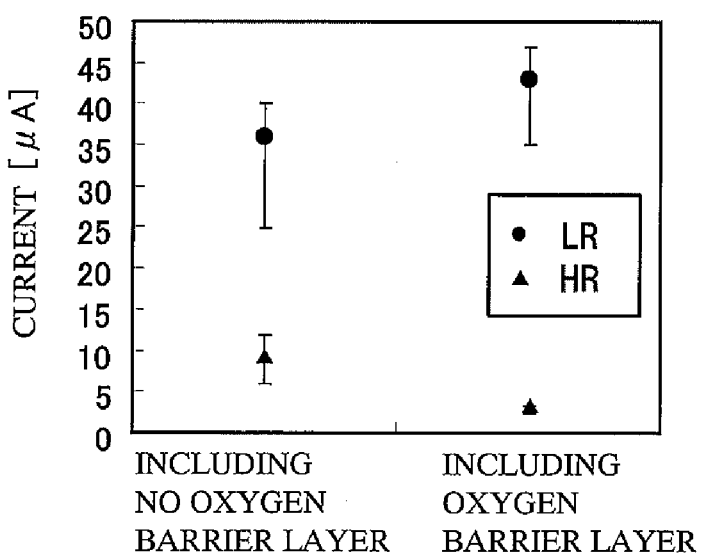
FIG. 15 is a view showing a comparison between a current value (HR) corresponding to a higher-resistance state and a current value (LR) corresponding to a lower-resistance state, which occur in a case where the element including the oxygen barrier layer and the element including no oxygen barrier layer are caused to perform a resistance changing operation, in Experiment 5.

FIG. 15 is a view showing a comparison between a current value (HR) corresponding to a higher-resistance state and a current value (LR) corresponding to a lower-resistance state, which occurred in a case where the element including the oxygen barrier layer and the element including no oxygen barrier layer were caused to perform a resistance changing operation, in Experiment 5. FIG. 15 shows data of the elements created by using the mask with a size of (500 nm×500 nm). The applied voltage was 0.4V.

As shown in FIG. 15, there was a greater difference between HR and LR in the element including the oxygen barrier layer than in the element including no oxygen barrier layer. In addition, there was a smaller degree of fluctuation of currents in the element including the oxygen barrier layer than in the element including no oxygen barrier layer. It was presumed that these results were attributed to the fact that the oxygen barrier caused an increase in the effective element size, which resulted in improved characteristics, and that the oxygen barrier suppressed migration of oxygen from the interlayer insulating layer, which resulted in uniform structure of the variable resistance layer.

Modified Example 1

In modified example 1, in the manufacturing method of the variable resistance memory device of one of Embodiment 1 and Embodiment 2, the step accompanied by heating other than the deposition step and the etching step is performed after the step of forming the uppermost non-volatile memory element layer is completed.

The deposition step refers to the step of depositing a layer and the step of increasing a layer thickness by CVD, sputtering, etc.

The etching step refers to the step of scraping a layer and the step of forming a contact hole and the like in a layer, by etch back, etching process, etc.

The step accompanied by heating other than the deposition step and the etching step may be at least one step selected from the group consisting of the step of removing a moisture from the interlayer insulating layer by heating, the step of heating a metal wire for hardening, and the step of heating to restore a defective of a transistor formed at a underside of a lowermost non-volatile memory element layer.

The sintering step (step of stabilizing a threshold voltage by restoring the defective in the transistor, the step of removing a moisture from the interlayer insulating layer, the step of heating the wire for hardening, etc.) provides great heat budget and tends to affect the oxygen profile of the non-volatile memory element. Therefore, by performing the sintering step after formation of all of the non-volatile memory element layers is completed, it becomes possible to suppress fluctuation of the element characteristics among the non-volatile memory element layers. The "heat budget" refers to, for example, a value representing an evaluation of an accumulated heating amount as to how a particular event is affected by the accumulated heating amount.

Modified Example 2

In modified example 2, the manufacturing method of the variable resistance memory device of one of Embodiment 1 and Embodiment 2 further includes the step of forming a current steering element placed in series with the non-volatile memory element.

Figure 16:
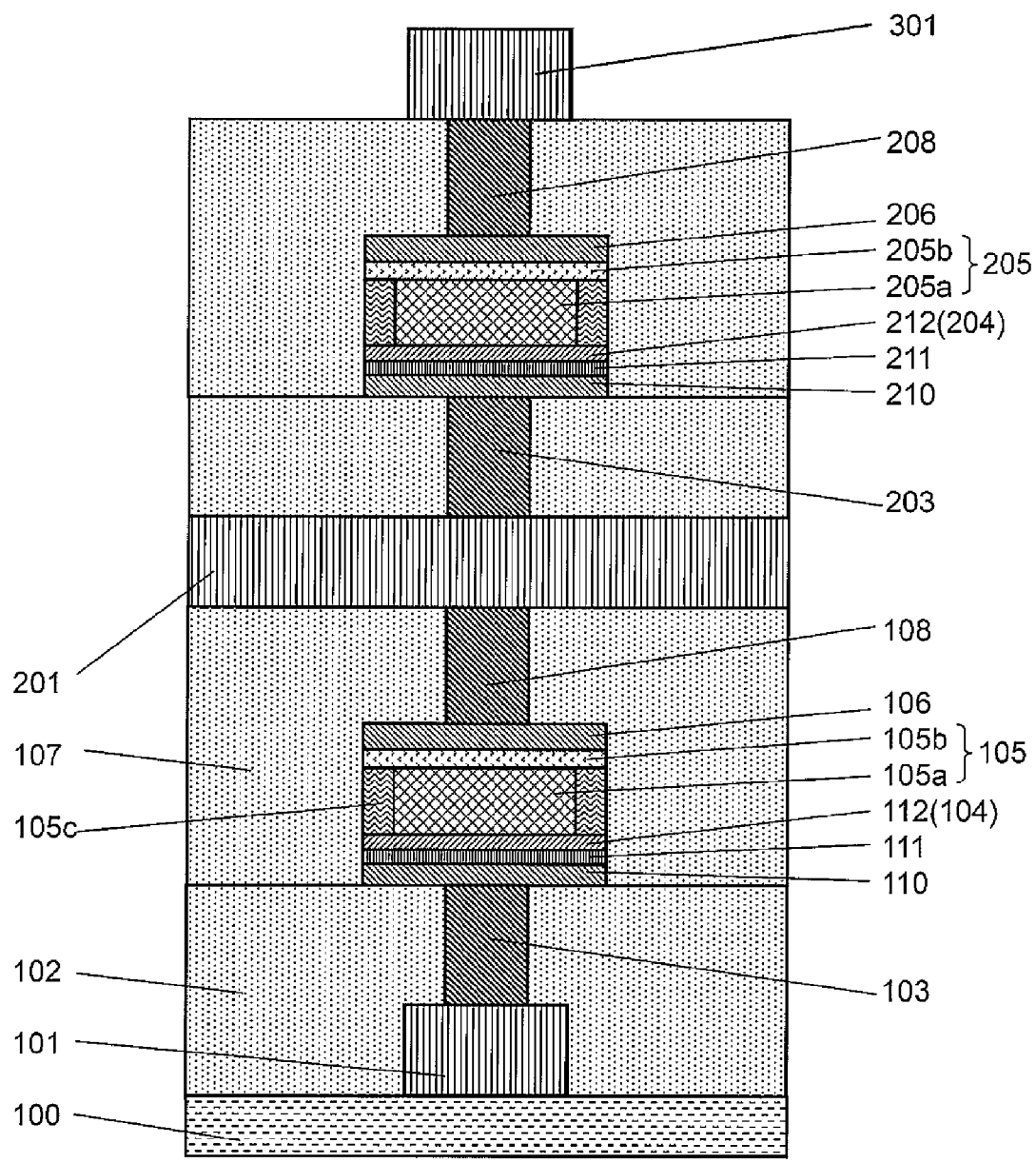
FIG. 16 is a view showing an exemplary schematic configuration of a variable resistance non-volatile memory element according to Modified example 1.

FIG. 16 is a view showing an exemplary schematic configuration of a variable resistance non-volatile memory element according to Modified example 2.

As shown in FIG. 16, in the variable resistance memory device according to Modified example 2, a current steering element in the first non-volatile memory element layer, which comprises a first electrode layer 110, a current steering layer 111, and a second electrode layer 112, is placed in series with the non-volatile memory element in the first non-volatile memory element layer, which comprises the lower electrode layer 104, the variable resistance layer 105 and the upper electrode layer 106. In addition, a current steering element in the first non-volatile memory element layer, which comprises a first electrode layer 210, a current steering layer 211, and a second electrode layer 212, is placed in series with the non-volatile memory element in the first non-volatile memory element layer, which comprises the lower electrode layer 204, the variable resistance layer 205 and the upper electrode layer 206.

Since the current steering element is placed in each cell, an influence of a leak current can be lessened. Thus, it becomes easier to implement a cross-point memory having a higher capacity.

Although in the example of FIG. 16, the lower electrode layer 104 and the second electrode layer 112 are an identical member, they may be separate members, respectively. Also, although in the example of FIG. 16, the lower electrode layer 204 and the second electrode layer 212 are an identical member, they may be separate members, respectively.

Although in the example of FIG. 16 in each of the non-volatile memory element layers, the non-volatile memory element is placed on and above the current steering element, the current steering element may be placed on and above the non-volatile memory element. Moreover, a vertical positional relationship between the current steering element and the non-volatile memory element may be reversed, between a particular non-volatile memory element layer and another non-volatile memory element layer.

Numeral modifications and alternative embodiments of the present invention can be made by those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A variable resistance non-volatile memory device and a manufacturing method thereof of the present invention are useful as a variable resistance non-volatile memory device and a manufacturing method thereof which are able to suppress fluctuation of element characteristics in a case where non-volatile memory elements each including a variable resistance layer including a plurality of transition metal oxide layers which are different from each other in oxygen content atomic percentage and are stacked together, are stacked together, more effectively than a conventional variable resistance non-volatile memory device and a conventional manufacturing method thereof.

REFERENCE SINGS LISTS 10 non-volatile memory element
100 substrate 101 first wire
102 first interlayer insulating layer
103 first contact plug
104 lower electrode layer
105a first metal oxide layer
105b second metal oxide layer
105c third metal oxide layer
106 upper electrode layer
107 second interlayer insulating layer
108 second contact plug
109 oxygen barrier layer
110 first electrode
111 current steering layer
112 second electrode
201 second wire
202 third interlayer insulating layer
204 lower electrode layer
205a first metal oxide layer
205b second metal oxide layer
205c third metal oxide layer
206 upper electrode layer
207 fourth interlayer insulating layer
208 fourth contact plug
209 oxygen barrier layer
210 first electrode
211 current steering layer
212 second electrode
301 third wire

The invention claimed is:

1. A method of manufacturing a variable resistance non-volatile memory device including non-volatile memory element layers stacked together by repeating a step of forming a non-volatile memory element layer plural times, the step of forming the non-volatile memory element layer including steps of:
  forming a lower electrode layer;
  forming a variable resistance layer on and above the lower electrode layer; and
  forming an upper electrode layer on and above the variable resistance layer; and
the step of forming the variable resistance layer including steps of:
  forming a first metal oxide layer comprising a first metal oxide; and
  forming a second metal oxide layer comprising a second metal oxide having a higher oxygen content atomic percentage than the first metal oxide, wherein:
when a thickness of the second metal oxide layer included in each of the non-volatile memory element layers just after the step of forming a corresponding non-volatile memory element layer is completed is a thickness in formation, and
when an area of a portion of the second metal oxide layer included in each of the non-volatile memory element layers and a portion of the first metal oxide layer included in a corresponding non-volatile memory element layer, which portions are in contact with each other, just after the step of forming the corresponding non-volatile memory element layer is completed is an area in formation,
at least one of the thickness in formation and the area in formation is made different among the steps of forming the non-volatile memory element layers, to cause all of the non-volatile memory element layers in a state in which formation of an uppermost non-volatile memory element layer is completed, to have an equal initial resistance.

2. The method of manufacturing the variable resistance non-volatile memory device according to claim 1,
wherein by diffusion of oxygen including diffusion of oxygen from the second metal oxide layer to the first metal oxide layer, in the steps of forming all of the non-volatile memory element layers, at least one of the thickness in formation and the area in formation is made different, among the steps of forming the non-volatile memory element layers, to cause all of the non-volatile memory element layers, in a state in which formation of the uppermost non-volatile memory element layer is completed, to have an equal initial resistance.

3. The method of manufacturing the variable resistance non-volatile memory device according to claim 1,
wherein the thickness in formation is greater in the step corresponding to a lower non-volatile memory element layer, among the steps of forming the non-volatile memory element layers.

4. The method of manufacturing the variable resistance non-volatile memory device according to claim 3,
wherein when the thickness in formation in the step of forming a lower non-volatile memory element layer is D1 and the thickness in formation in the step of forming an upper non-volatile memory element layer is D2, regarding a combination of two steps of forming the non-volatile memory element layers, which occur successively, among the steps of forming the non-volatile memory element layers,
D2<D1<(1.1×D2) is satisfied.

5. The method of manufacturing the variable resistance non-volatile memory device according to claim 1,
wherein the step of forming the non-volatile memory element layer includes the step of forming a third metal oxide layer comprising a third metal oxide having a higher oxygen content atomic percentage than the first metal oxide, on an outer peripheral portion of the first metal oxide layer such that the second metal oxide layer is interposed between the first metal oxide layer and the third metal oxide layer, and the electrode.

6. The method of manufacturing the variable resistance non-volatile memory device according to claim 5,
wherein in the step corresponding to a lower non-volatile memory element layer, among the steps of forming the non-volatile memory element layers, an area of a portion of the third metal oxide layer and a portion of the second metal oxide layer, which portions are in contact with each other, just after the step of forming the corresponding non-volatile memory element layer is completed, is smaller.

7. The method of manufacturing the variable resistance non-volatile memory device according to claim 5,
wherein in the step corresponding to a lower non-volatile memory element layer, among the steps of forming the non-volatile memory element layers, an area of the upper electrode layer, just after the step of forming the corresponding non-volatile memory element layer is completed, is greater.

8. The method of manufacturing the variable resistance non-volatile memory device according to claim 1,
wherein the step of forming the non-volatile memory element layer includes the step of forming an oxygen barrier layer on a side wall of the variable resistance layer.

9. The method of manufacturing the variable resistance non-volatile memory device according to claim 1, wherein in the step corresponding to a lower non-volatile memory element layer, among the steps of forming the non-volatile memory element layers, the area in formation is greater.

10. The method of manufacturing the variable resistance non-volatile memory device according to claim 1,
wherein a step accompanied by heating, other than a deposition step and an etching step, is performed after the step of forming the uppermost non-volatile memory element layer is completed.

11. A variable resistance non-volatile memory device comprising non-volatile memory element layers stacked together,
each of the non-volatile memory element layers including a lower electrode layer, a variable resistance layer formed on and above the lower electrode layer, and an upper electrode layer formed on and above the variable resistance layer,
the variable resistance layer including a first metal oxide layer comprising a first metal oxide, and a second metal oxide layer comprising a second metal oxide having a higher oxygen content atomic percentage than the first metal oxide, wherein:
when a thickness of the second metal oxide layer included in each of the non-volatile memory element layers just after formation of the corresponding non-volatile memory element layer is completed is a thickness in formation, and
when an area of a portion of the second metal oxide layer included in each of the non-volatile memory element layers and a portion of the first metal oxide layer included in the corresponding non-volatile memory element layer, which portions are in contact with each other, just after formation of the corresponding non-volatile memory element layer is completed is an area in formation,
at least one of the thickness in formation and the area in formation is made different among the non-volatile memory element layers, to cause all of the non-volatile memory element layers to have an equal initial resistance.

12. The variable resistance non-volatile memory device according to claim 11,
wherein all of the non-volatile memory element layers are caused to have an equal initial resistance, by diffusion of oxygen including diffusion of oxygen from the second metal oxide layer to the first metal oxide layer, in the steps of forming all of the non-volatile memory element layers.

13. The variable resistance non-volatile memory device according to claim 11,
wherein the thickness in formation is greater in a lower non-volatile memory element layer.

14. The variable resistance non-volatile memory device according to claim 13,
wherein when the thickness in formation in a lower non-volatile memory element layer is D1 and the thickness in formation in an upper non-volatile memory element layer is D2, regarding a combination of two non-volatile memory element layers which are adjacent to each other, $D2<D1<(1.1\times D2)$ is satisfied.

15. The variable resistance non-volatile memory device according to claim 11,
wherein the variable resistance layer includes a third metal oxide layer comprising a third metal oxide having a higher oxygen content atomic percentage than the first metal oxide, on an outer peripheral portion of the first metal oxide layer; and
wherein the second metal oxide layer is interposed between the first metal oxide layer and the third metal oxide layer, and the electrode.

16. The variable resistance non-volatile memory device according to claim 15,
wherein in a lower non-volatile memory element layer, an area of a portion of the third metal oxide layer and a portion of the second metal oxide layer, which portions are in contact with each other, just after formation of the corresponding non-volatile memory element layer is completed, is smaller.

17. The variable resistance non-volatile memory device according to claim 15,
wherein in a lower non-volatile memory element layer, an area of the upper electrode layer, just after formation of the corresponding non-volatile memory element layer is completed, is greater.

18. The variable resistance non-volatile memory device according to claim 11,
wherein the non-volatile memory element layer includes an oxygen barrier layer formed on a side wall of the variable resistance layer.

19. The variable resistance non-volatile memory device according to claim 11,
wherein the area in formation is greater in a lower non-volatile memory element layer.

20. The variable resistance non-volatile memory device according to claim 11, being obtained by performing a step accompanied by heating, other than a deposition step and an etching step, after formation of an uppermost non-volatile memory element layer is completed.

* * * * *